(12) United States Patent
Ikeda et al.

(10) Patent No.: US 8,227,702 B2
(45) Date of Patent: Jul. 24, 2012

(54) MULTILAYER CERAMIC SUBSTRATE, ELECTRONIC COMPONENT, AND METHOD OF MANUFACTURING MULTILAYER CERAMIC SUBSTRATE

(75) Inventors: Hatsuo Ikeda, Tottori (JP); Koji Ichikawa, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 511 days.

(21) Appl. No.: 12/385,134

(22) Filed: Mar. 31, 2009

(65) Prior Publication Data
US 2009/0251869 A1 Oct. 8, 2009

(30) Foreign Application Priority Data
Apr. 2, 2008 (JP) ................. 2008-096215

(51) Int. Cl.
*H05K 1/09* (2006.01)
(52) U.S. Cl. .......................... 174/256; 361/760
(58) Field of Classification Search .......... 174/256, 174/261, 262, 266; 361/760
See application file for complete search history.

(56) References Cited

U.S. PATENT DOCUMENTS

| | | | |
|---|---|---|---|
| 2006/0102384 A1* | 5/2006 | Watanabe et al. | 174/256 |
| 2006/0273816 A1 | 12/2006 | Hsu | |
| 2009/0071707 A1* | 3/2009 | Endo et al. | 174/266 |
| 2009/0200069 A1* | 8/2009 | Kariya et al. | 174/255 |
| 2010/0252318 A1* | 10/2010 | Takahashi et al. | 174/262 |

FOREIGN PATENT DOCUMENTS

| | | |
|---|---|---|
| EP | 1 043 922 A1 | 10/2000 |
| JP | A-2001-189550 | 7/2001 |
| JP | A-2005-286303 | 10/2005 |
| JP | A-2007-305740 | 11/2007 |

OTHER PUBLICATIONS

Aug. 19, 2009 Search Report issued in European Patent Application No. 09157079.6.

* cited by examiner

*Primary Examiner* — Hien Vu
(74) *Attorney, Agent, or Firm* — Oliff & Berridge, PLC

(57) ABSTRACT

A multilayer ceramic substrate in which an active element and a passive element are surface-equipped over the outermost surface on one side is provided. The multilayer ceramic substrate comprises a plurality of laminated ceramic substrate layers, a surface layer terminal electrode provided in a via hole of an outermost ceramic substrate layer on at least one side and having a surface layer via electrode and a metal plating layer deposited over an end surface of the surface layer via electrode, and a via conductor which connects the surface layer terminal electrode and circuit patterns over the ceramic substrate layer at the inside, wherein a via hole size of a surface layer terminal electrode for connection of the active element is smaller than a via hole size of a surface layer terminal electrode for connection of the passive element.

12 Claims, 16 Drawing Sheets

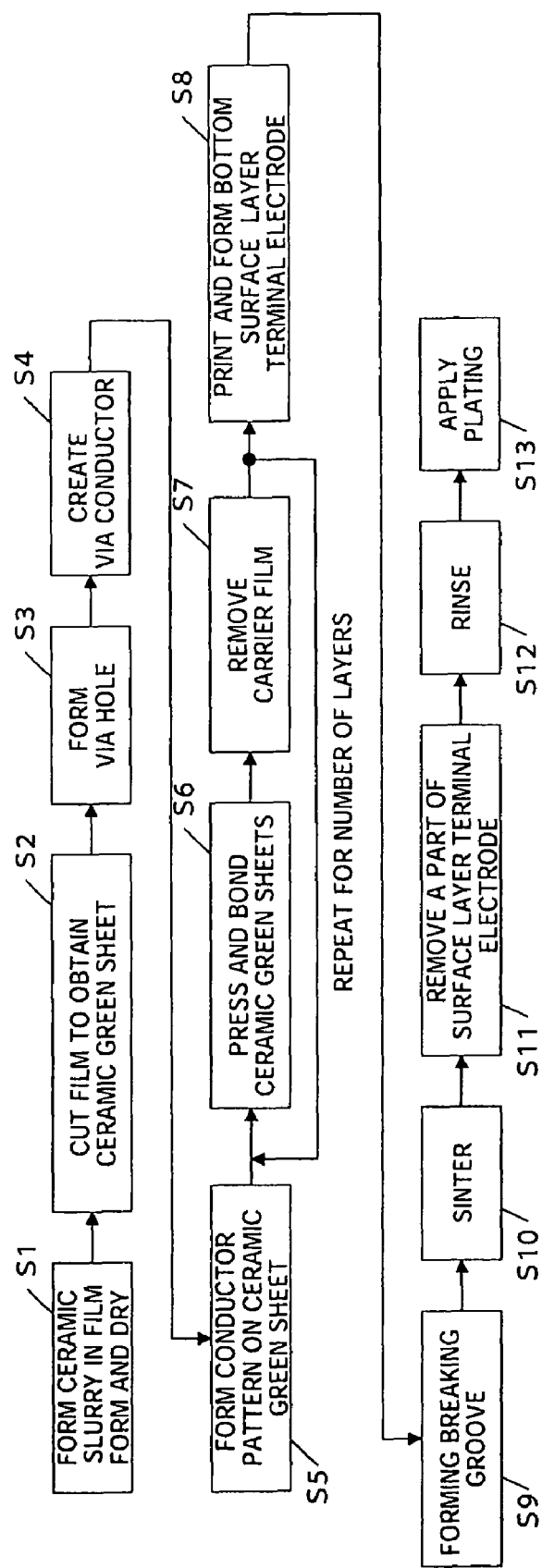
FG. 1

MULTILAYER CERAMIC SUBSTRATE, ELECTRONIC COMPONENT, AND METHOD OF MANUFACTURING MULTILAYER CERAMIC SUBSTRATE

BACKGROUND OF THE INVENTION

1. Field of the Invention

The present invention relates to a multilayer ceramic substrate, an electronic component, and a manufacturing method of a multilayer ceramic substrate.

2. Related Art

Recently, with many devices for which high performance and small size are desired such as a cellular phone, a multilayer ceramic substrate is widely in use. In a typical multilayer ceramic substrate, a plurality of ceramic substrate layers are laminated, which have conductor layer(s) internal circuit patterns are formed between the ceramic substrate layers. These circuit pattern layer(s) are connected by a conductor which is called a via conductor.

JP 2007-305740 A (hereinafter referred to as "Patent Document 1") discloses an example structure of such a multilayer ceramic substrate. The multilayer ceramic substrate disclosed in the Patent Document 1 comprises a ceramic laminated structure in which a plurality of ceramic layers are laminated, a recess which is formed on one main surface of the ceramic laminated structure, a connection electrode which is exposed to the inside of the recess, and a terminal electrode having, as a main composition, a conductive resin which is filled in the recess and which is electrically connected to the connection electrode.

However, the multilayer ceramic substrate disclosed in the Patent Document 1 is targeted to improving a shock resistance of the connection terminal electrode with the mother substrate. Because of this, a conductive resin is required at the connection portion, and it is desired that the depth of the resin be 100 μm or greater. However, as the size of the electrode is reduced, filling of the resin becomes more difficult, and manufacturing also becomes difficult. In addition, stable attachment of metal plating on the surface of the conductive resin is not realistic. Moreover, although the Patent Document 1 discloses that a Ag—Pd alloy and a Ag—Pt alloy are suitable for high-frequency usage because these alloys have a small specific resistance, there is no consideration of the influences on the mechanical strength when the alloys are used on a surface for connecting a surface mounting component.

JP 2005-286303 A discloses that a terminal electrode on a surface is bent toward an inner layer and is covered with an insulator so that the ends are strengthened and a laminated ceramic substrate is realized which has a superior mechanical strength. However, in consideration of the positioning accuracy during the process, the size of the strengthening portion which is bent and extended toward the inner layer requires 50 μm-100 μm, and, thus, there is a limit on application to future products having a small size and high density.

JP 2001-189550 A discloses a technique in which a portion of the via hole conductor exposed to the surface is formed recessed from a surface of a multilayer ceramic substrate by 20 μm or less and a curved surface of a solder ball has good fitting to an edge of the recess so that a self positioning function (self-alignment) is achieved. However, in this Patent Document 3 also, the mechanical strength between the bump and the via hole conductor is not taken into consideration. In addition, because self-alignment is the purpose, the depth of the recess must be designed relatively deep. When the recess is formed relatively deeply as in this structure, a soldering process tends to have difficulty to reduce pores in the solder connection, resulting in a loss of mechanical or connection reliability. In this case, even if a metal plating is to be provided, because the via conductor is formed using a conductive paste having a large shrinkage ratio, the plating solution is left in the inner wall of the via hole, possibly resulting in corrosion.

On the outermost surface of the multilayer ceramic substrate, an LGA (LAND GRID ARRAY), a BGA (BALL GRID ARRAY), and a pad-shaped surface electrode having a circular or rectangular shape are formed in a complicated circuit pattern. Spacing between the electrodes is becoming narrower such as few hundreds of μm-150 μm, and, in the case of a semiconductor package component, the spacing becomes even narrower due to a flip chip mounting. Because of this, BGA which uses a solder ball of few hundred μm diameter formed on a electrode bump, on which a solder ball is mounted, is becoming to a mainstream, but in this case, the number of solder balls varies from few tens to few hundreds, and even in some cases, one thousand or more. Although the number varies depending on the usage and function of the semiconductor element, connection shear strength of about 50 gf (0.49 N) or greater is required per one electrode. This number is at a high level as a connection by a solder ball of few hundred-μm diameters.

In the case of a chip component, on the other hand, because the number of electrodes is small originally from the design requirement, the methods of using pad-shaped surface electrode having a circular or rectangular shape or the LGA are selectively used, placing higher priority on the connection strength. However, for these components also, it is desirable that the electrodes are high density and high strength.

Under the above-described circumstances, there had been a need for a multilayer ceramic substrate which has a terminal electrode structure having a high performance at high frequency, insulation reliability, corrosion resistance, and a high mechanical strength, and a manufacturing method thereof.

The present invention was conceived in view of the above circumstances, and an advantage of the present invention is that a surface layer terminal electrode is narrowed so that a size of the multilayer ceramic substrate itself is reduced and the density is increased. Another advantage of the present invention is to provide a multilayer ceramic substrate in which the connection strength of a surface mounting component or the like can be improved with a structural configuration even when the size of the terminal electrode is reduced, in which the possibility of corrosion due to the remaining of plating solution or the like is low, an electronic component which uses such a multilayer ceramic substrate, and a method of manufacturing the multilayer ceramic substrate.

SUMMARY OF THE INVENTION

According to one aspect of the present invention, there is provided a multilayer ceramic substrate in which a plurality of ceramic substrate layers are laminated, the multilayer ceramic substrate comprising a surface layer terminal electrode which is provided at an outermost ceramic substrate layer on at least one side of a front side and a back side and which comprises a surface layer via electrode and a metal plating layer deposited over an end surface of the surface layer via electrode, and a via conductor which connects the surface layer terminal electrode and circuit patterns over an internal ceramic substrate layer, wherein the surface layer via electrode has its end surface in a via hole provided in the outermost ceramic substrate layer and at a level recessed from a surface of the outermost ceramic substrate layer, and a surface of the metal plating layer deposited over the end surface of the surface layer via electrode is at an approximate same plane as the surface of the outermost ceramic substrate layer or at a level recessed from the surface of the outermost ceramic substrate layer. The approximate same plane in this case refers to an allowance up to, for example, about 3 μm and of at most a protrusion of less than the thickness of the metal plating layer.

BRIEF DESCRIPTION OF THE DRAWINGS

FIG. 1 is a flowchart showing an example of a manufacturing method of a multilayer ceramic substrate according to a preferred embodiment of the present invention.

DESCRIPTION OF PREFERRED EMBODIMENT(S)

Figure 2A:
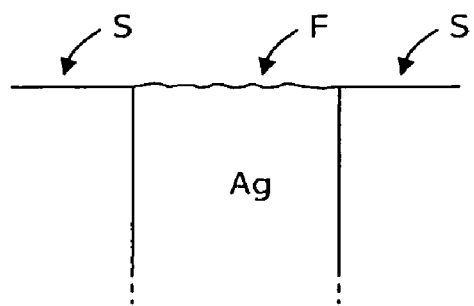
FIG. 2 is an explanatory diagram showing an example of a cross section in a manufacturing process of a multilayer ceramic substrate according to a preferred embodiment of the present invention.

A preferred embodiment of the present invention will now be described with reference to the drawings. FIG. 1 is a flowchart showing a manufacturing process of a multilayer ceramic substrate according to a preferred embodiment of the present invention.
[Structure of Multilayer Ceramic Substrate]

In a process of forming a multilayer substrate according to a preferred embodiment of the present invention, first, a plurality of ceramic green sheets are created. For this purpose, a slurry comprising powder of a ceramic material which can be sintered at a low temperature, powder of glass composition, and a mixture of an organic binder, plasticizer, and a solvent is formed over an organic carrier film (for example, a PET film) in a shape of a film of a predetermined thickness through a doctor blade method and is dried (S1). The thickness of the slurry after the drying process is approximately 20 μm-200 μm in this example configuration, although the thickness may vary depending on the objective.

As the ceramic material which can be sintered at a low temperature which is used for the ceramic green sheet, any ceramic material which is known as LTCC ceramic, which can be co-fired with a conductor material such as silver (Ag) at a temperature of 800° C.-1000° C. (hereinafter referred to as "conductor paste") may be used. As an example, a mixture having, when Al, Si, Sr, and Ti which is a primary constituent is described in equivalence of $Al_2O_3$, $SiO_2$, SrO, and $TiO_2$, $Al_2O_3$ in 10 weight %-60 weight %, $SiO_2$ in 25 weight %-60 weight %, SrO in 7.5 weight %-50 weight %, or $TiO_2$ in 20 weight % or less (including 0), a secondary constituent, included for 100 weight part of the primary constituent, which is at least one of Bi, Na and K, in an amount in equivalence of $Bi_2O_3$ of 0.1 weight part-10 weight part, in an amount in equivalence of $Na_2O$ of 0.1 weight part-5 weight part, and in an amount in equivalence of $K_2O$ of 0.1 weight part-5 weight part, at least one of Cu, Mn, and Ag in an amount in equivalence of CuO of 0.01 weight part-5 weight part, in an amount in equivalence of $MnO_2$ of 0.01 weight part-5 weight part, and in an amount of Ag of 0.01 weight part-5 weight part, and other unavoidable impurities is calcined at a temperature of 700° C.-850° C. and is pulverized so that a dielectric ceramic composition is obtained comprising a fine ground particles of an average particle size of 0.6 μm-2 μm.

The production of the ceramic green sheet which can be sintered at a low temperature is not limited to the doctor blade method described herein, and the ceramic green sheet may be produced by, for example, rolling (extrusion), printing, inkjet application, transfer method, or the like. After the ceramic green sheet is obtained, the ceramic green sheet is cut, to obtain a plurality of ceramic green sheets (S2). Although the handling with the green sheet is easy, it is also a reasonable manufacturing method to provide the green sheet for later processes such as printing while repetitively winding and unwinding in a roll shape without the cutting process.

Then, a via hole is formed in each ceramic green sheet using laser or the like based on the designed circuit (S3), a conductor paste having silver (Ag) as the primary constituent is placed in each via hole through a printing screen, the conductor paste is forced into the via hole with a squeegee, and excessive conductor paste is removed, to create a via conductor (S4). In addition, on the surface of each ceramic green sheet including a ceramic green sheet for the first layer at an upper surface, a conductor pattern corresponding to the designed circuit is printed and formed in a thickness of 5 μm-35 μm using a conductor paste such as silver (Ag) (S5). With these conductor patterns, internal circuit patterns such as an inductor, a transmission line, a capacitor, a ground electrode, etc. are formed, and, the circuit patterns on the next layer are connected to each other through via conductors, to form the designed circuit patterns. The via hole may be formed by opening a hole with a mechanical puncher.

In the case of the ceramic green sheet for the first layer at the upper surface, the pattern must be printed such that a fine conductor pattern is narrowly placed and a large number of small-size mounting components and semiconductor components can be mounted. In this process, if the process of filling and printing a conductor paste having Ag as a primary constituent in the via hole and the process of forming the surface conductor pattern are executed for a plurality of times in an overlapping manner, a position offset issue tends to occur, and, thus, a high density cannot be realized. Therefore, it is also possible to fill and print the via hole at once, executing also the printing process of the surface conductor pattern.

Then, the plurality of ceramic green sheets on which the via conductor and/or the conductor pattern is formed is bonded through pressing (S6), a process of removing the carrier film (S7) is repeated for a number of times corresponding to the number of the ceramic substrate layers, and a non-sintered multilayer ceramic laminated structure (hereinafter simply referred to as "non-sintered multilayer ceramic structure") is created.

As an example, a ceramic green sheet to be positioned at an outermost surface side of the non-sintered multilayer ceramic structure is set on a fixing film, and bonded on a fixing film through pressing with a die at a predetermined pressure and a predetermined temperature for a predetermined time period. For example, the pressure is set at 1 MPa to 5 MPa (10 kgf/cm$^2$ to 50 kgf/cm$^2$), the temperature is set at 30° C. to 60° C., and the time period is set at 3 seconds to 15 seconds. The upper and lower dies for the thermal bonding may have a simple plate shape with a built-in heater. After the bonding by press is completed, the carrier film of the ceramic green sheet is removed. In this process, the green sheet is fixed on the fixing film, and is not removed with the carrier film when the carrier film is removed.

Then, a ceramic green sheet of a second layer is laminated. On the ceramic green sheet, the conductor pattern forming a part of the internal circuit patterns are printed. The ceramic green sheet is set so that the main surface of the ceramic green sheet is in contact with the ceramic green sheet of the first layer, and is bonded through pressing similar to the ceramic green sheet of the first layer. In this process, the pressing temperature is set at a temperature in which an adhesive in the print paste is softened and fixed, so that the printed portion is connected to the facing ceramic green sheet by a pressurizing force. Therefore, the ceramic green sheets are bonded through the printed conductor paste. In addition, the portion where there is no electrode, but the ceramic layers directly contact each other is also bonded by softening and fixing, similar to the portion where there is an electrode. Normally, the bonding temperature in this case can be a low temperature of approximately 40° C. to 90° C., although the specific temperature depends on the type of the adhesive, and the bonding strength can be adjusted by changing the pressurizing force. After the sheets are bonded, the carrier film of the ceramic green sheet is removed. The ceramic green sheets of the third and the later layers are laminated in a process similar to that for the ceramic green sheet of the second layer. In order to integrate the laminated structure more strongly, it is also possible to apply a further pressure bonding process after all sheets are laminated.

In addition, a part or all of the sequence of processes of bonding, removing, and laminating may be executed under an atmosphere of a reduced pressure. With such a method, pores between ceramic green sheets can be easily removed, the dimensional precision during lamination can be maintained, and delamination can be reduced.

In the present embodiment, at the bottom surface (the opposite surface facing to the surface of the outermost ceramic substrate layer) of the non-sintered multilayer ceramic structure obtained through a process described above, a surface layer electrode on the bottom surface is printed and formed based on the designed circuit using a conductor paste having Ag as a primary constituent (S8).

Moreover, it is also possible to suitably form an overcoat member around the conductor patterns on the surface and bottom surface of the substrate. As the material of the overcoat member, it is desirable to use a material which has sinter shrinkage characteristics and thermal expansion characteristics similar to those of the non-sintered multilayer ceramic structure. For example, a material may be considered in which an additional constituent for adding a function to improve the visibility of a coating portion is added to a slurry having the same materials as the ceramic green sheet. By providing the overcoat at the periphery of the surface conductor pattern and forming an electrode coverage region, it is possible to protect the conductor pattern mechanically at the surface and prevent short-circuiting such as that occurring, for example, by solder provided over the conductor pattern in the later process flowing and contacting a undesirable conductive portion. The conductor pattern on the surface of the substrate and the overcoat member do not need to be provided at the state of the non-sintered multilayer ceramic structure, and may alternatively be formed onto the surface of the multilayer ceramic substrate after sintering.

In the present embodiment, the non-sintered multilayer ceramic structure thus obtained is thermally bonded in a CIP (Cold Isostatic Press, herein after referred to as "CIP") machinery at a pressure of 10 MPa to 40 MPa (100 kgf/cm$^2$ to 400 kgf/cm$^2$) and a temperature of 85° C., and a non-sintered multilayer ceramic structure in which the layers are integrated is formed.

Then, a means of separation is formed with a jig such as a knife cutter on a surface of the non-sintered multilayer ceramic structure, to form a breaking groove (S9). The breaking groove is formed in a different shape depending on the size of the collective substrate and the size of the final substrate product after breaking. The breaking groove is formed with a sufficient dimensional margin so that an adverse effect such as damages to the conductor pattern forming a part of the circuit does not occur, and is formed with a distance of approximately 100 μm to 250 μm from the conductor end, viewed from the top. The breaking groove is, for example, a V-shaped channel, and a depth, for example, when the breaking grooves are formed on both upper and lower surfaces, is such that a sum of the channel depths on both surfaces is less than or equal to 30% of the thickness of the non-sintered multilayer ceramic structure. The depth differs depending on the thickness of the non-sintered multilayer ceramic structure, but is typically set at approximately 0.01 mm to 0.2 mm. If the depth is too deep, the releasing of the cutter becomes inferior, resulting in a greater tendency of deformation which results in a starting point of crack in the sintering process. The breaking groove does not need to be formed on both surfaces, and may alternatively be formed on one of the upper and lower surfaces.

The method of dividing is not limited to a method of splitting along the V-shaped channel, but it may alternatively be achieved without forming the groove. The process like dicing or scribing after the sintering process can be applied later.

Then, the non-sintered multilayer ceramic structure is integrally sintered under temperature of 800° C.-1000° C. which is a sintering temperature, in a sintering furnace (S10). At this stage, at the cross section of the via hole, as exemplified in FIG. 2a, a surface (F) of the surface layer via electrode which is a part of the external terminal electrode and the surface (S) of the outermost ceramic substrate layer are approximately at the same plane.

[Etching of Surface Layer Via Electrode]

Figure 2B:
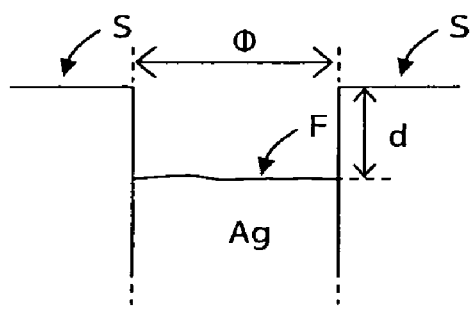

In the present embodiment, the structure is immersed in an etching solution which has a function to dissolve the surface layer via electrode (here, Ag), and a part of the surface layer via electrode is removed (S11). In other words, at this stage, in the cross section of the via hole, as shown in FIG. 2b, the surface (F) of the surface layer via electrode is etched to a level inside the via hole and recessed with respect to the surface (S) of the outermost ceramic substrate layer. In the following description, the surface after a plating layer is formed on the surface layer via electrode will be referred to as an "end surface" for distinction. As the etching solution, a mixture solution including any of nitric acid, aqua regia, or hydrogen peroxide may be used. When the conductor material to be used is copper or an alloy or the like primarily having copper, ammonium persulfate may be used as the etching solution. With the etching, the surface level of the surface layer via electrode is recessed with respect to the surface of the outermost ceramic substrate layer, and a preferable surface properties can be obtained. With this process, a film of the Ni plating, Au plating, etc. can be formed with a high quality over the electrode in the later processes. In other words, with the use of the etching solution, excessive Ag attached to the rough surface of the inner wall of the via hole can be dissolved and removed, and, thus, such a configuration contributes to improvement in sticking force (anchor effect). In addition, with the etching process, the surface of the via hole can be sufficiently wet, and tiny pores can be removed, and, thus, it is possible to prevent defects due to tiny deposition defect in the later plating step.

In the process of dissolving the surface layer via electrode, in order to obtain a sufficient etching effect without creating damages to the electrode and without reducing a contact strength between the electrode and the ceramics, the type, concentration, and temperature of the etching solution are adjusted. This adjustment is set experimentally and empirically. As an example, it is desirable that the solution contains 1 volume %-20 volume % for nitric acid, 1 volume %-25 volume % for aqua regia, 1 volume %-30 volume % for an etching solution containing hydrogen peroxide solution, and 1 volume %-30 volume % for hydrochloric acid. The stirring method in the etching bath needs to be sufficiently cared. In every etching step, the thickness of the remaining electrode is measured using a measurement method such as fluorescent X-rays and is compared with the thickness before etching, to check the etching reaction rate and strictly control the process conditions. In addition, when the etching solution contains, as a constituent, a constituent which is easily volatilized or a constituent which easily decomposes, it is desirable to periodically collect a sample of the solution and titrate the sample, to monitor the concentration of each constituent. The concentration of the etched conductor metal dissolved into the solution is also periodically monitored in a similar manner.

With regard to the quantitative control such as the recess depth by the etching, the control is achieved by controlling the type, concentration, and temperature of the etching solution. However, it is necessary that the concentration should not be over diluted. Because, for example, if the concentration is extremely diluted, the performance of the etching solution will be easily degraded in only a small load of etching process, resulting in the necessity for frequent adjustment. In addition, because the primary constituent of the etching solution is volatile in many cases, it is appropriate to set the temperature to 50° C. or less. If the temperature is higher, the concentration and mixing ratio of constituents of the etching solution would easily vary. Moreover, a stirring operation such as circulation of the etching solution and some oscillation or rotation of the ceramic substrate are effective in controlling the reaction rate including keeping the uniformity of the etching solution. It is desirable to combine these adjustment methods, and a fine tuning can be made by adjusting etching process time while monitoring each process batch or each lot.

For the etching process, it is also possible to employ, in place of the method of immersion in an etching solution, a method of applying the etching solution to transfer with a roller-shaped application head or a method in which the etching solution is sent in a fountain-like manner from a lower position toward the ceramic substrate which is held in a horizontal position. In these methods, it is possible to seal the ends of the held substrate by pressing with a rubber packing or the like and apply the process for each side while avoiding the wraparound of the etching solution to the opposite side. The surface to be sealed with the packing member may be selected depending on the design of the device, and type and characteristics of the etching solution. Normally, because small terminal electrode on the surface layer is present in a non-uniform distribution on an upper surface over which a semiconductor and a small-size chip component are mounted, the structure of the surface layer terminal electrode of the present invention is effective for such an upper surface layer. However, in many cases, on the lower surface layer on the opposite side (bottom surface), only about 20-30 LGA (Land Grid Array) electrodes are provided having a size of 1 mm or greater, and, thus, on the lower surface layer (bottom surface) in which the electrode size is large and a high strength can be realized, the terminal electrode structure of the present embodiment is not necessary in some cases. In such a case, the above-described one-side process is often effective. The one-side process is also superior in the environmental load such as that the amount of water necessary for later rinsing process can be reduced, and also has an advantage in the manufacturing process such as the equipment design including drying and that the overall process management can be easily and inexpensively performed.

[Metal Plating Layer]

After the etching process, a sufficient rinsing process is applied (S12), and then, plating is applied (S13). In the process of plating, in order to uniformly form the plating even for a component having a complicated circuit structure, typically, an electroless plating is applied. As an example, a Ni base layer plating is deposited in 3 μm-10 μm, and then, a Au plating is deposited in 0.03 μm-0.5 μm. In order to prevent chemical reaction such as undesired diffusion of the Ni base plating layer during usage as a product, a buffer layer may be plated between the Ni base plating and the Au plating.

Figure 2C:
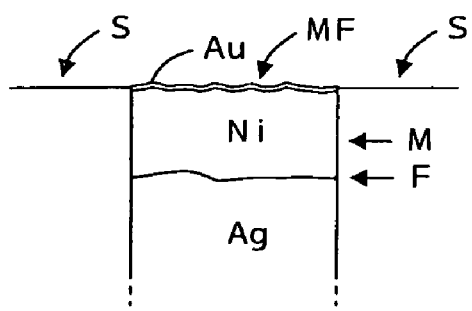

With the process of plating, as shown in FIG. 2c, a metal plating layer (M) is deposited over the surface layer via electrode (F), and the surface (MF) of the metal plating layer is set to be on an approximate same plane level as the surface (S) of the outermost ceramic substrate layer (as will be described next, protrusion is less than the thickness of the metal plating layer (in the above-described example, up to only 3 μm)). More specifically, because a solder ball or the like will be placed over the surface of the metal plating layer, it is preferable that the surface does not protrude too much and a recess be not formed too deeply. As the range for this structure, from experiences, preferably, the surface is at a level of 3 μm or less from the surface S of the outermost ceramic substrate layer in the direction of projection, and, more preferably, is at a level deeper from the surface S of the outermost ceramic substrate layer by about 3 μm in the direction of recess and has a depth of 10 μm or less. With the above-described process, the surface layer terminal electrode comprising the surface layer via electrode (F) and the metal plating layer (M) deposited above (on the end surface of) the surface layer via electrode is formed. In this process, it is important that the metal plating layer is in fine contact along the rough surface without any pores nor gaps between the metal plating layer and the end surface of the surface layer via electrode and between the metal plating layer and the inner wall of the via hole.

[Case of Non-Shrinkage Method]

After the step S9, the formation of the breaking groove, a non-shrinkage method may be used in which a constraining green sheet which constrains the substrate from shrinkage during sintering is placed on the surface of the non-sintered multilayer ceramic structure. Here, the constraining green sheet is formed by creating a ceramic slurry in which an organic binder, a plasticizer, and a solvent are added to an inorganic material which does not sinter at the sintering temperature of the non-sintered multilayer ceramic structure, and casting a film of the slurry through a doctor blade method over the carrier film in a predetermined thickness (for example, 100 μm-200 μm).

The ceramic material used for the constraining green sheet may be any material which is not sintered at the sintering temperature of the glass ceramic material used for the ceramic green sheet (about 800° C.-1000° C.) and which has a function not to shrink the surface of the non-sintered multilayer ceramic structure. As the inorganic material, typically, alumina is used. For the organic binder, plasticizer, and the solvent, materials similar to those used for the ceramic green sheet may be used.

Prior to the sintering process, the constraining green sheets are positioned and laminated on the upper and lower surfaces of the non-sintered multilayer ceramic structure so that the thickness of the constraining green sheets is about 200 μm, and thermally bonded in a CIP machinery at 10 MPa-40 MPa (100 kgf/cm²-400 kgf/cm²) and 85° C., so that a laminated structure is obtained in which a constraining layer comprising the constraining green sheet and the non-sintered multilayer ceramic structure are integrated.

Next, the laminated structure is integrally sintered in a sintering furnace at step S10 at a temperature of 800° C.-1000° C. which is a temperature in which the non-sintered multilayer ceramic structure sinters, while de-binder of the constraining layer is suitably applied.

When the constraining green sheet is used as described above, most of the inorganic particles after sintering can be easily removed, but the inorganic particles remaining on the surface layer via electrode may not be easily removed. In such cases, it is efficient to apply an ultrasonic cleaning process to remove the remaining inorganic particles. In this process, if the ultrasonic cleaning process is applied to the etching solution as a pre-process step of the etching (step S11), the surface of the surface layer via electrode (Ag) can be etched and the inorganic particle can be removed at the same time, and, thus, such a configuration is preferable. Alternatively, it is also possible to apply the ultrasonic cleaning during the rinsing process (S12), for reliable cleaning.

[Form of Via Hole and Surface Layer Terminal Electrode]

Figure 3:
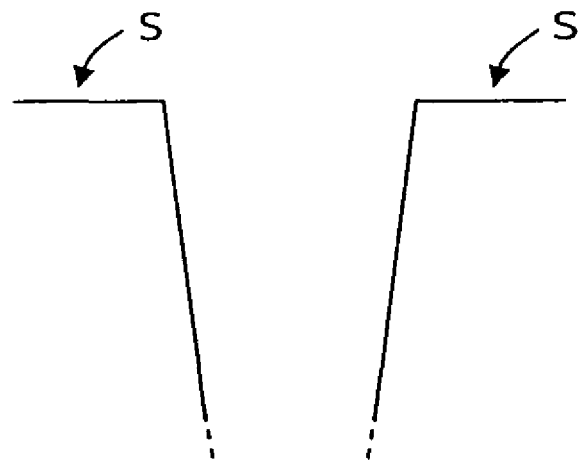
FIG. 3 is a cross sectional view showing an example shape of a via hole formed in a multilayer ceramic substrate according to a preferred embodiment of the present invention.

In the formation of the via hole in step S3, as shown in FIG. 3, the via hole may be formed in a tapered hole shape which enlarges toward the outermost surface S.

With the via hole having the tapered shape, the inner side wall length of the ceramic in contact with the metal plating layer is increased, and, consequently, the area of contact between the metal plating layer and the inner wall of the via hole is increased and the anchor effect is increased. Thus, such a structure contributes to an increased strength. In particular, the advantage is significant because the inner wall surface of the via hole in reality has some rough surface which are tangled each other. On the other hand, if the via hole is a deep, straight recess, there may be cases where the metal plating layer does not tend to precipitate in close contact from the bottom of the recess toward the top, and there is a possibility that the plating solution or the like is captured in the tiny space of rough surface on the inner wall of the via and remains there.

On the other hand, when the via hole has a tapered shape, the plating solution can easily circulate from the relatively wide opening portion to the relatively narrow inner portion, and, thus, the growth rate of the plating can be maintained uniformly at higher side. It is possible to grow the plating as thick as 15 μm, which is approximately the same plane level as the surface of the ceramic substrate layer within practical plating time. In this process, the metal plating layer precipitates filling the via hole without a gap continuously from the bottom portion of the via, and it is possible to prevent the plating solution from being captured and remaining in the tiny space of rough surface of the inner wall of the via. Because of this, the contact of the metal plating layer to the inner wall of the via is improved, and, thus, such a structure contributes to increasing the mechanical connection strength by the anchor effect. In addition, a problem such as the plating solution remaining inside and later oozing, inducing corrosion or the like does not tend to occur. However, the direction of the tapered hole is not limited, and the via hole may be formed, for example, in a tapered shape narrowing toward the outermost surface.

Figure 4:
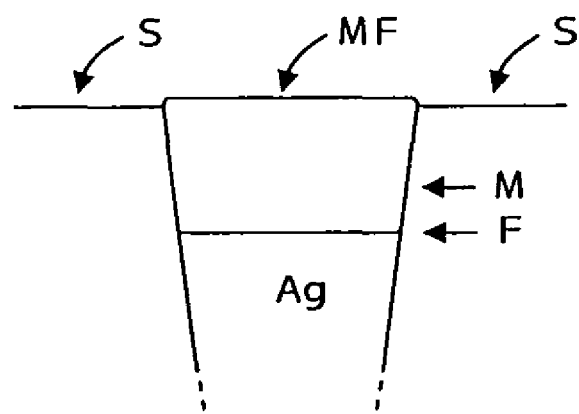
FIG. 4 is a cross sectional view showing an example of an inside of the via hole in a multilayer ceramic substrate according to a preferred embodiment of the present invention.

In the multilayer ceramic substrate created by the method of the present embodiment, as schematically shown in FIGS. 2C and 4, the surface of the surface layer terminal electrode is formed so that the surface layer via electrode has its surface F at a recessed level with respect to the surface S of the outermost ceramic substrate. In addition, the metal plating layer is deposited on the surface layer via electrode. Then the surface MF of the metal plating layer is at an approximate the same plane as the surface S of the outermost ceramic substrate, or at a recessed level from the surface S.

The surface layer via electrode is sintered with the sintering of the ceramic substrate in the sintering process (S10). In this process, it can be considered that the boundary between the metal material of the surface layer via electrode and the ceramic substrate (inner wall surface of the via hole) has some roughness tangled each other, the anchor effect is developed, and a mutual contacting force is generated. In the range of the sintering temperature of 850° C.-1000° C., silver (Ag) or copper (Cu) which is the material of the surface layer via electrode reacts at the interface or diffuses mutually with the ceramic so that these materials increase the contact force, and then contributes to increasing the over all contacting force.

Figure 13:
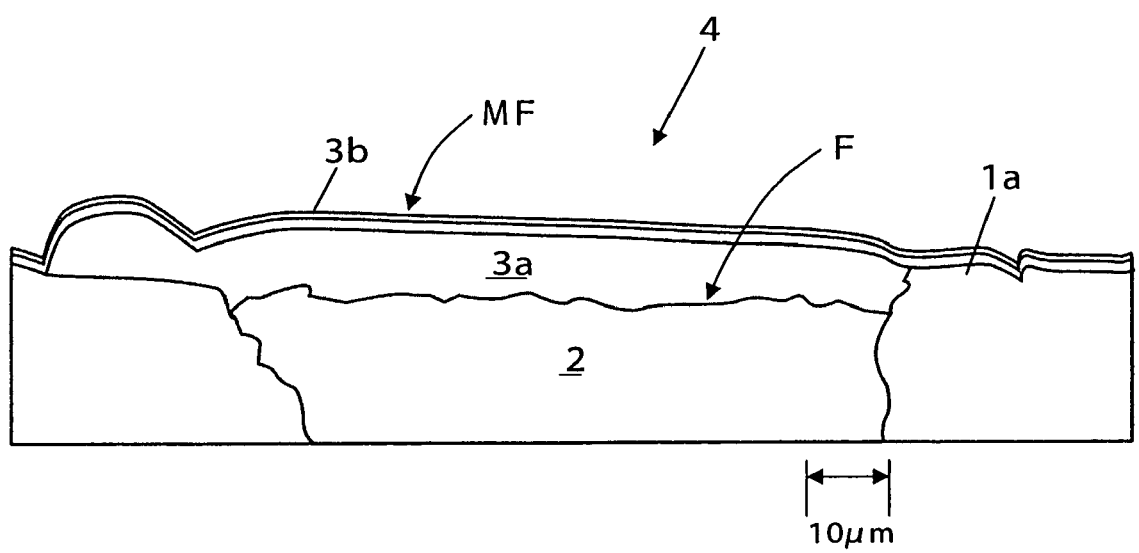
FIG. 13 is an explanatory diagram showing an example cross section of a surface layer terminal electrode in a multilayer ceramic substrate according to a preferred embodiment of the present invention.
Figure 14:
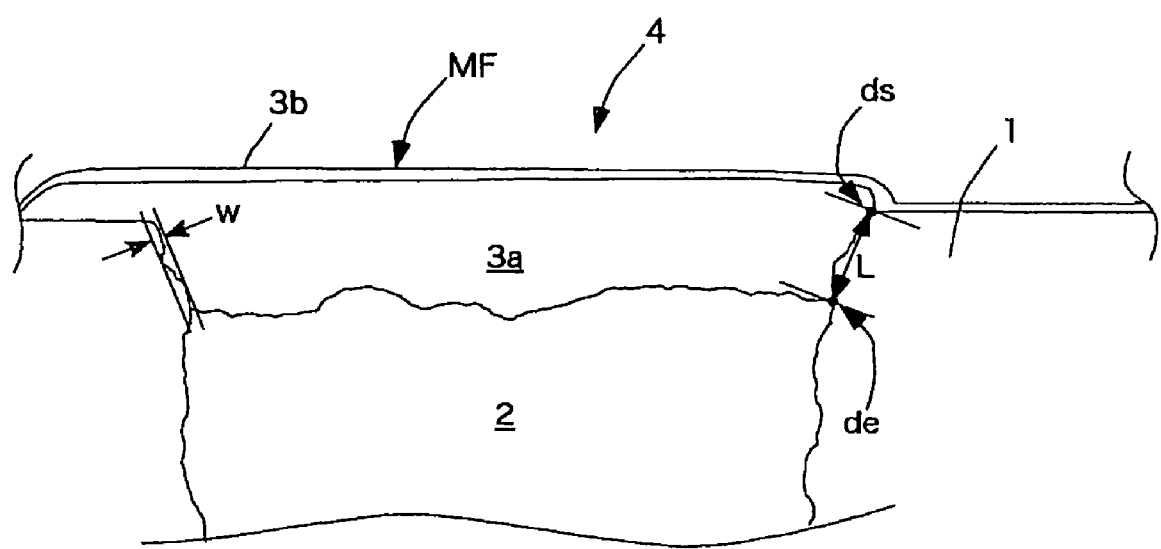
FIG. 14 is a schematic view showing an example cross section of a surface layer terminal electrode in a multilayer ceramic substrate according to a preferred embodiment of the present invention.

Although in FIGS. 2-4, the boundary between the surface layer terminal electrode and the ceramic substrate is schematically shown in a straight line shape, in reality, some roughness is formed as shown in FIGS. 13 and 14.

As shown in a scanning electron microscope photograph (with a magnification of 3000) of FIG. 13 showing the cross section of the surface layer terminal electrode 4, there are no pores or gap between the Ni base plating 3a and the end surface F of the surface layer via electrode 2. Similarly, the Ni base plating 3a is closely in contact with the roughness of the inner wall of the via, without pores or gaps. In this manner, the metal plating layers 3a and 3b precipitates along the roughness, and the boundary matches in close contact (matches without gap), and the length of the boundary and the widths of the roughness affect the connection strength.

The contact length L of the boundary is measured, as exemplified in FIG. 14, by drawing a virtual center line in the direction of the depth (thickness) of the ceramic substrate between a starting point ds and an ending point de where the metal plating layer 3 closely matches the inner wall of the via, and a length of at least 2 μm is required. Although it can be considered that the connection strength is increased as the length is increased, the preferable range is about 3 μm-8 μm, because of some limitation in the manufacturing such as the etching repeatability and labor in the process of removing the surface layer via electrode as described above. The width w of the roughness of the boundary is measured by drawing a virtual line between a starting point and an ending point where the metal plating layer 3 closely matches (matches without gap), through a point of maximum projection (point closest to the center of the via hole) and parallel to the virtual center line. Then, another parallel virtual line which is parallel to the virtual line and passing through a point of minimum recess (point farthest away from the via hole center) is drawn, and finally the width w of the roughness is defined as the distance between the two virtual lines. The roughness width w is preferably set at 0.6 μm or greater. The roughness width w depends on a large number of factors such as the thermal shrinkage behavior of the ceramic material to be used, the thermal shrinkage behavior of the conductor material to be filled into the via hole, precision of the via hole machining, residues after machining in the case of laser via machining, and shape and size of the via hole inner wall and the peripheral thermal influence region. Because of the excellent controllability in process parameters, adjusting the laser machining is effective. In this method, the factors such as the thermal influence region can be controlled by changing primary machining conditions such as the energy, pulse width, and number of the shots. The preferable range of the roughness width w is about 0.9 μm-5 μm empirically.

When the metal plating layer 3 comprises the Ni base 3a and the Au coverage 3b, it can be considered that this structure contributes to the strength improvement also because the nickel (Ni) base layer 3a having a relatively high strength is in close contact with the inner wall of the via hole, tracing the roughness on the inner wall of the via hole. In other words, the Young's modulus of nickel (Ni) is 200 GPa, which is high compared to the Young's modulus of silver (Ag) which is 83 GPa and the Young's modulus of copper (Cu) which is 130 GPa, which are the materials of the surface layer via electrode 2, and, thus, in the case of nickel (Ni), the characteristics of more firmly maintaining the state of close contact with the inner wall of the via hole and durability against the external force is high, and the anchor fixing effect can be sufficiently realized. Here, the thickness of the nickel (Ni) base layer 3a is preferably 3 μm or greater, and more preferably in a range of 4 μm-8 μm.

[Shear Strength]

FIGS. 13 and 14 exemplify the cross section of the surface layer terminal electrode 4 in the multilayer ceramic substrate of the present embodiment. In a typical substrate of the related art shown in FIG. 17, the via conductor extends to the outermost surface, and the end surface of the surface layer via electrode 2 continuously connected to the via conductor is at the approximate same plane level as the surface S of the outermost ceramic substrate or projects from the surface S of the outermost ceramic substrate. In the case of such a structure of the related art, the surface layer terminal electrode is in the state of strong close contact at a corner portion (R) of the opening of the via hole on the side of the surface, and, when an external force is applied from the lateral direction such as in the shear strength test, the corner portion in which the stress tends to concentrate tends to become a starting point of breakdown.

On the other hand, as shown in FIGS. 2C, 4, 13, and 14, when the via conductor is extended to the direction of the outermost surface and the end surface F of the surface layer via electrode 2 which is continuously connected to the via conductor is recessed in the depth direction of the via hole from the surface S of the outermost ceramic substrate 1. And the metal plating layer 3 deposited on the end surface F is at the approximate same plane level as the surface S of the outermost ceramic substrate 1 or at a recessed level from the surface S, the upper end periphery of the surface layer via electrode 2 is in close contact with the inner wall of the via hole, but not with the corner portion of the opening on the surface of the via hole which tends to break due to concentrated stress. The approximate same plane level in this case refers to a state of projection in an amount less than the thickness of the metal plating layer 3 (for example, 3 μm or less) from the surface S of the outermost ceramic substrate 1. The metal plating layer 3 may be deposited on the corner portion of the opening on the surface of the via hole (the metal plating layer 3 does not need to stay inside the via hole and, when the recess on the surface of the surface layer via electrode 2 is shallow, the outermost side of the metal plating layer 3 may spread wider in an umbrella shape with a slight projection from the surface S of the outermost ceramic substrate 1). If the projection is less than or equal to 3 μm, even when the length of the boundary closely in contact with the inner wall of the via hole is about 2 μm, the anchor effect will prevail, and damages can be avoided. In addition, although there is an anchor effect between the material of the metal plating layer 3 and the ceramic substrate by the engagement on the rough wall surface, the chemical reaction and the mutual diffusion is relatively small compared to the material of the surface layer via electrode 2, and, thus, it can be considered that a stress concentration that may lead to the breakdown does not tend to occur and, as a result, such a structure has a high strength.

Figure 5:
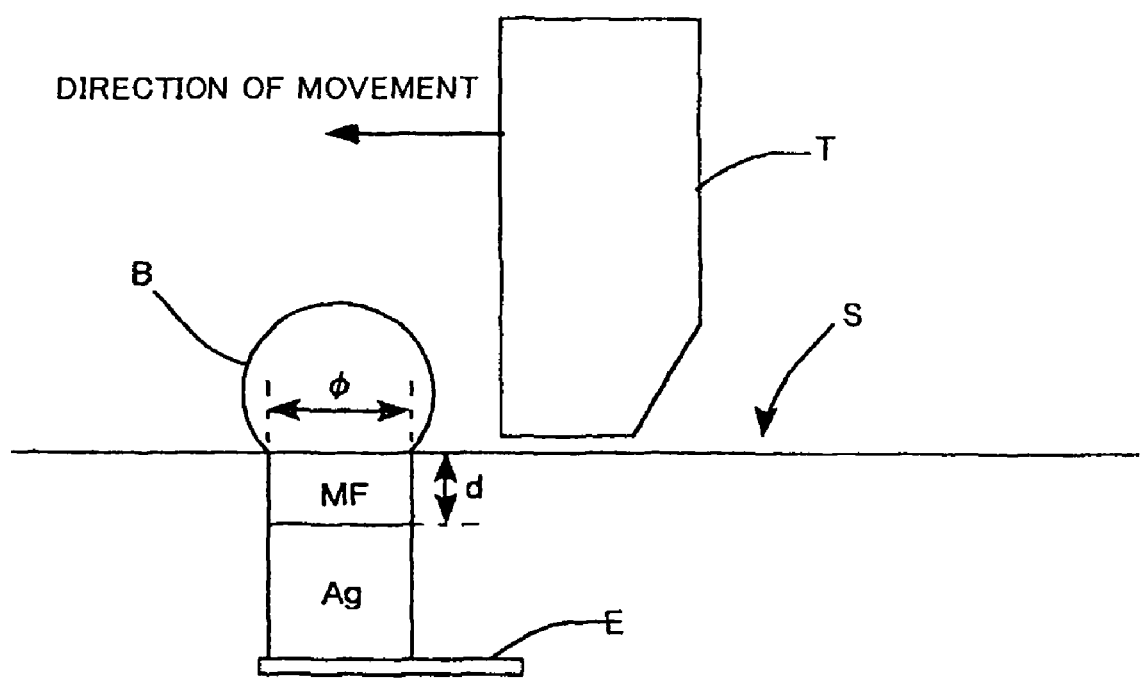
FIG. 5 is an explanatory diagram showing an example of a shear test.

Here, the shear strength test is a test for measuring the strength of the surface electrode of an LTCC (Low Temperature Co-fired Ceramics) substrate. As exemplified in FIG. 5, a solder ball B is mounted on the surface layer terminal electrode (surface layer via electrode (Ag) and metal plating layer (MF)) which is connected to a circuit pattern E on a lower layer, a shear test tool T having an approximate vertical surface with respect to the surface S of the ceramic substrate is transitioned at a predetermined movement speed (for example, 0.2 mm/s) maintaining constant height (for example, 30 μm) from the ceramic substrate surface S, a shearing (shear) force is applied to the solder ball B from the lateral direction, and a breakdown strength is measured.

Because the breakdown strength also differs depending on the area of the surface of the metal plating layer (pad area), it is also possible to normalize and evaluate the measured value of the breakdown strength measured in the test using the pad area which is measured in advance, and obtain the normalized strength.

Figure 17:
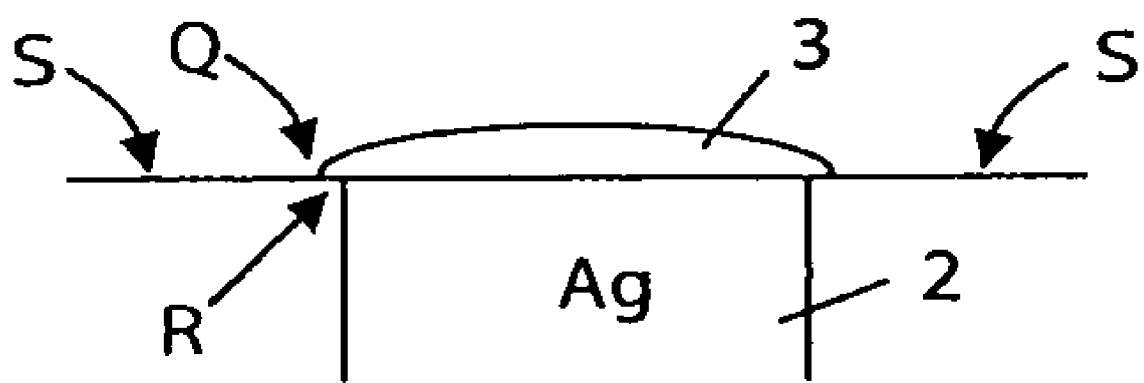
FIG. 17 is a cross sectional view showing an example of a multilayer ceramic substrate in related art.

In addition, when the metal plating layer 3 is deposited on the surface of the surface layer via electrode 2 at the approximate same plane as the surface of the outermost ceramic substrate, such as in the typical structure of the related art, as shown in FIG. 17, the end of the metal plating layer 3 has a pointing shape and contacts the surface S of the ceramic substrate (Q). Therefore, when an external force is applied from the lateral direction as in the shear strength test, the stress tends to concentrate on the pointing end of the metal plating layer, which tends to become a starting point of the breakdown. In a normal plating process, nickel (Ni) base layer is applied for its excellent mechanical strength, which leads to a stress concentration. Therefore, it makes higher risk having a starting point of breakdown.

In the multilayer ceramic substrate of the present embodiment, as shown in FIGS. 2C and 4, the surface of the surface layer via electrode is recessed from the surface of the outermost ceramic substrate in a depth direction of the via hole. In addition, when the metal plating layer deposited thereon (end surface) is at the approximate same plane as the surface of the outermost ceramic substrate (projecting from the surface by less than the thickness of the metal plating layer (for example, 3 µm or less)) or at a recessed level, the end of the metal plating layer does not become a pointing shape and is strongly closely contact the inner wall of the via hole on all peripheral surfaces. Because of this, the structure is achieved in which breakdown by stress concentration does not tend to occur, and, thus, the structure has a high strength.

Figure 6:
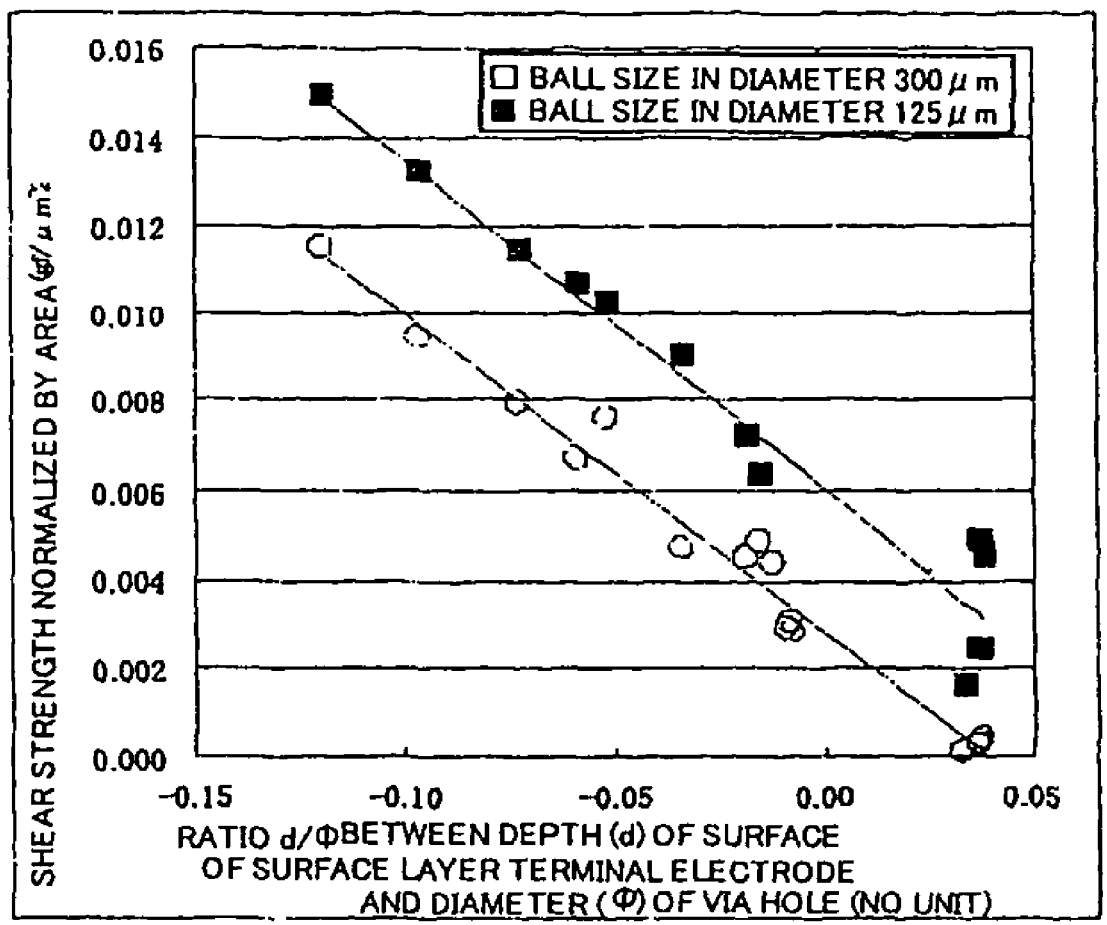
FIG. 6 is an explanatory diagram exemplifying a relationship between a depth d from a surface of an outermost ceramic substrate to an end surface of a surface layer via electrode and a shear strength in a multilayer ceramic substrate according to a preferred embodiment of the present invention.
Figure 7:
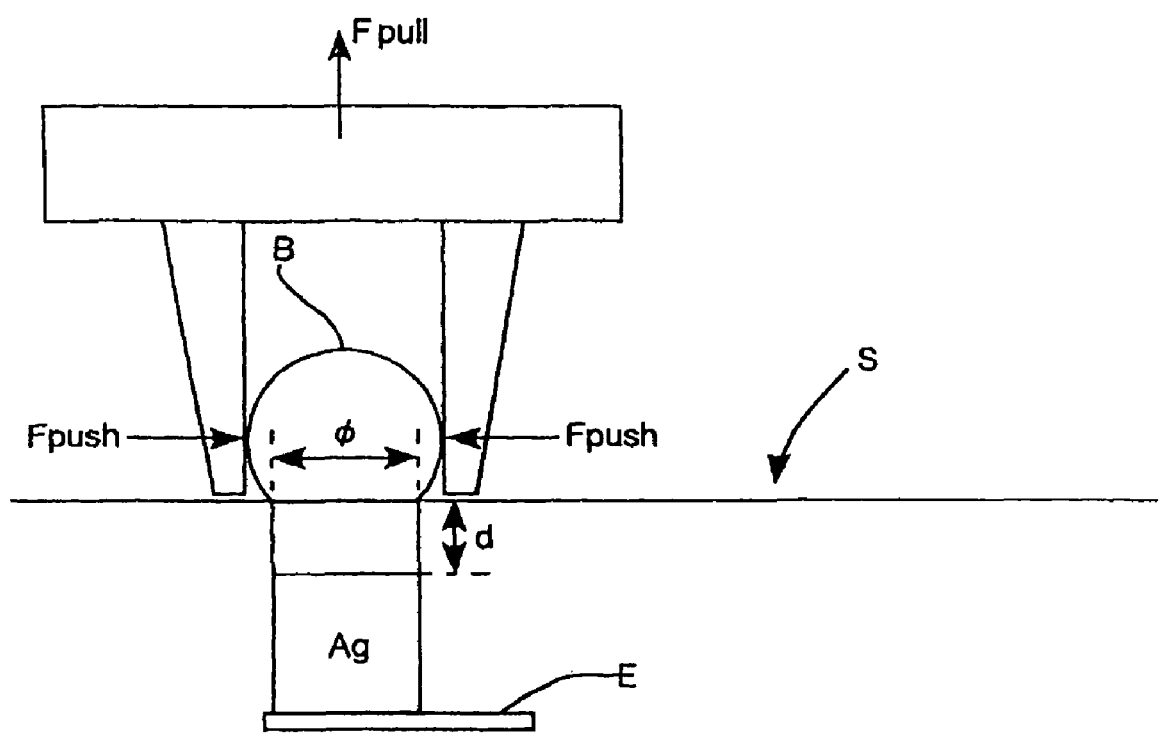
FIG. 7 is an explanatory diagram showing an example of a pull test.

The result of the shear strength test when the size of the solder ball is set to 300 µm and 125 µm while changing the depth d from the surface of the outermost ceramic substrate to the surface of the surface layer via electrode is shown in the following Table 1 (for the case of solder ball size of 125 µm), Table 2 (for the case of solder ball size of 300 µm), and FIG. 6. The thickness of the metal plating layer (Ni base+Au coverage) is adjusted here at 4-8.5 µm, and, in the examples, the surface of the metal plating layer is at a recessed level or within a level of protrusion of 3 µm or less. The depth d from the surface of the outermost ceramic substrate to the end surface of the surface layer via electrode is divided by the via hole diameter ϕ (as the via hole becomes smaller, the via hole diameter becomes close to the pad size). This is because when the via hole diameter is increased, namely, when the pad size is increased, the moment caused by the external force becomes larger and the breakdown tends to occur.

[Table 1]
[Table 2]

Since the results of these actual measurements vary almost linearly, they can be represented by a straight line through a first-order regression, the straight line representing the shear strength f is $$f=-0.0747 \times (d/\phi)+0.006$$

when the solder ball size is 125 µm, and is $$f=-0.0713 \times (d/\phi)+0.0028$$

when the solder ball size is 300 µm. Here, the value of d is set positive for projection from a reference (±0) at the surface of the outermost ceramic substrate and negative for recess (this similarly applies to the following description).

It is assumed that, for the strength per unit area of the surface area terminal electrode, it is sufficient that the strength of 0.0064 gf/µm² (0.000063 N/µm²) is obtained for the case of the solder ball size of 125 µm. This value corresponds to, for a surface layer terminal electrode having a diameter ϕ of 100 µm, a strength of about 50 gf (0.49 N) per electrode, and, in consideration of the fact that, normally, 10 or more connection electrodes are present per semiconductor chip, to an overall absolute strength of about 500 gf (4.9 N). In typical cases, a resin material which is called a under-fill may be filled in the gap between the semiconductor chip and the ceramic substrate, to further improve the strengthening effect.

In the case of the solder ball size of 300 µm where the moment of the shearing force becomes relatively large, because the point of contact of the shear strength test tool on the solder ball is high, the force moment is increased, resulting in a smaller target value of the strength. While the height of the contact point for the case of the solder ball size of 125 µm was 45 µm in average, the height of the contact point for the case of the solder ball size of 300 µm was 103 µm. Accordingly, the moment of the shearing force (shear strength) was increased by a factor of 2.29. Therefore, it was determined that the necessary strength per unit area for the case of the solder ball size of 300 µm should be 0.0028 gf/µm² (0.000027 N/µm²) or greater. When the solder ball size is large, in general, the diameter of the surface layer terminal electrode is also accordingly increased. Because a diameter of at least 150 µm or greater is normally chosen, and, in such cases, the necessary strength corresponds to the strength of about 49 gf (0.48 N) per electrode. If there are 10 or more connection electrodes, an overall absolute strength of about 500 gf (4.9 N) can be obtained.

From the above, the condition is satisfied if $d/\phi<0$ for the case of the solder ball size of 300 µm. In addition, in the case of the solder ball size of 125 µm in which the moment of the shearing force is relatively small, the condition is satisfied with $d/\phi<-0.005$. The shear strength could only be measured up to a diameter of the surface layer terminal electrode of a maximum of 150 µm. With a larger diameter, the solder ball was flattened and the shear strength could not be measured.

When d is too deep, such a structure causes defect and is not advantageous in the manufacturing. As such a structure also is against the request of reducing the size, it is preferable to keep the depth less than about 15 µm. The thickness of each layer of the ceramic substrate including the outermost surface layer in the case of small size and high density component may be, in some cases, less than or equal to 15 µm, and thus, the depth would exceed the thickness of the layer. More specifically, when the diameter of the surface layer terminal electrode is 100 µm, a depth d of a recess 0.5 µm or deeper would satisfy the condition of $d/\phi<-0.005$. Because the practical depth d in consideration of a high-integration ceramic substrate is a recess of a maximum of about 15 µm compared to the layer thickness of the thin and high density ceramic substrate, a condition of $d/\phi \geq -0.12$ is desirable when the diameter of the surface layer terminal electrode is 125 µm. Because the depth of the surface layer via electrode is less than 15 µm (d>−15 µm) and the thickness of the metal plating layer (Ni+Au) is adjusted to 4 µm-8.5 µm, the surface of the metal plating layer is at a depth of less than 10 µm from the surface of the substrate. By setting the height less than or equal to 3 µm when the surface protrudes, there is another advantage that a self-alignment effect can be obtained in which the solder ball is naturally settled at a suitable position when the solder ball is placed. In addition, with this structure, the settling of solder ball becomes relatively superior, and, thus, such a structure is preferable.

As described above, based on the results of Tables 1 and 2, by adjusting the depth d from the surface of the outermost ceramic substrate to the surface of the surface layer via electrode so that a ratio d/φ between the depth d to the end surface of the surface layer via electrode when the surface of the outermost ceramic substrate layer is set as the ±0 reference plane (with direction toward the inside of the substrate being negative) and the diameter φ of the via hole is a negative value of greater than or equal to −0.12, it is possible to improve the connection strength with the components.

With this structure, a high shear strength can be maintained even when a surface layer terminal electrode which is even smaller and a solder ball which is even smaller (a size of 100 μm or less) are used in combination, and, thus, a multilayer ceramic substrate applicable to a smaller size and higher integration can be realized.

[Pull Test]

The advantage of the present embodiment was also confirmed with an evaluation method other than the shear test described above. For example, the strength was evaluated in a pull test which is a destructive test where a force (Fpush) is applied from a side surface by a chucking mechanism or the like to hold, in a pinching manner, and the solder ball is pulled by a force (Fpull) to a vertically upward direction (upward from substrate surface). A result of the pull test is shown in Table 3. In this case, unlike the shear test, no stress concentration occurs at the pointing shape portion, and, thus, it can be considered that the strength improvement effect solely due to the close contact of the metal plating layer, in particular, nickel having a high strength, on the inner wall of the via hole can be evaluated. Because of this, the strength improvement effect of the present embodiment was half or less compared to the shear test, but it was confirmed that a higher strength by about 2% to 30% can be similarly obtained. In the pull test, because the solder ball must be mechanically held, a solder ball having a large diameter, φ of 500 μm, was used for evaluation.

[Table 3]

In the description up to this point, a test result has been described for a state of each independent structure in the state where the solder ball is mounted on the small electrode, but here, a semiconductor electronic device which is one of the actual surface mount component was mounted, the shear strength and the pull strength were measured, and similar strength improvement effect was confirmed. In the case of the actual semiconductor electronic device, the number of solder balls in the connection to the ceramic substrate may vary from tens to few hundreds, in some cases, a thousand or more. The number depends on the usage and function of the semiconductor electronic device, and, in addition, the size of the connection surface electrode and the thickness of the semiconductor electronic device also significantly vary. Thus, the moments generated in the test load also differ significantly and it is difficult to normalize the moments, and, therefore, details are not shown here.

In addition, in the present embodiment, if the via hole is formed in a tapered shape, the contact length between the metal plating layer and the side surface of the via hole (inner wall of the via hole) is increased as described above. Moreover, the contact area between the surface layer via electrode and the inner wall of the via hole is also increased. With such a structure, the strength can be further improved. Furthermore, with the structure of a taper widening toward the outermost surface, the plating agent is more easily circulated during formation of the metal plating layer, the remaining of the agent in the rough boundary can be reduced, and the gap in the boundary between the ceramic substrate and the metal plating layer can be further reduced. In addition, the problem of corrosion resistance due to the remnant plating solution tends not to occur.

[Projection-Recess Length and Width of Inner Wall of Via Hole]

Next, the shape of the surface layer terminal electrode was observed for the multilayer ceramic substrate used in the above-described pull test. The sample was prepared by polishing a cross section of the multilayer ceramic substrate to make an observation surface, and a photograph of the area around the surface layer terminal electrode was captured using a scanning electron microscope (with a magnification of 3000). One example is shown in FIG. 13 and its schematic illustration is shown in FIG. 14. Because a little rough surface are formed on the inner wall of the via hole, the boundary between the rough surface and the metal plating layer was measured. The measurement was performed by drawing a virtual center line in a direction of depth (thickness) of the ceramic substrate between a starting point ds and an ending point de of the boundary as shown in FIG. 14 then the distance between ds and de gave a contact length L of the boundary. In addition, a virtual line passing through a point of maximum projection (point closest to the via hole center) and another parallel virtual line passing through a point of minimum recess (point farthest away from the via hole center) is drawn, and finally the width w of the roughness is defined as the distance between the two virtual lines. Similar to the above-described example, the shear strength was set to 0.0064 gf/μm² (0.000063 N/μm²) or greater for the solder ball size of 125 μm and set to 0.0028 gf/μm²(0.000027/μm²) for the solder ball size of 300 μm, and the pull strength was set, as reference, to 0.046 gf/μm²(0.00045 N/μm²) or greater for the solder ball size of 500 μm. The measurement result is shown in Table 4.

[Table 4]

It is estimated that the contact length L of the rough boundary and the roughness width w affect the strengths in a combined manner. Based on Table 4, it can be seen that a result of the pull strength of 0.048 gf/μm²(0.00047 N/μm²) or greater was obtained when the contact length of the boundary is 2.2 μm or greater (Example 3-13, etc.) and the roughness width is 0.9 μm or greater (Example 3-13, etc.). With regard to the shear strength also, the test was separately performed, the minimum strength of 0.0028 gf/μm²(0.000027 N/μm²) or greater was obtained in the examples. Therefore, based on the results of the Examples and Comparative Examples of Table 4, it can be considered that the lower limit of the contact length is 2 μm and the lower limit of the roughness width is 0.6 μm. On the other hand, there is no significant difference in the pull strength between the case of contact length 7.8 μm (Example 3-1) and the case of contact length 11.9 μm (Example 3-5). Because there is no improvement effect in the pull strength which was expected to have a high dependence on the contact length, it is concluded that a contact length of a maximum of about 8 μm is sufficient. With regard to the roughness width, a tendency can be observed that the strength is increased as the width is increased. In this regard, a similar result was obtained for the shear strength which expected to have a high dependency on the roughness width. Although it is difficult to control strictly the roughness on the inner wall of the via hole, based on the results of the experiments, it can be considered that the sufficient width about 5 μm at most.

[Another Form of Surface Layer Via Electrode]

The conductor paste for the via conductor used in the preferred embodiment by the first manufacturing method described above has 88 weight %-94 weight % silver (Ag) powder having an average particle diameter of less than 3.0 μm. When the average particle diameter of the Ag powder is greater than or equal to 3.0 μm, the filling characteristics to a small-size via having a diameter φ of less than 80 μm during printing becomes inferior. When the amount of the Ag powder is less than 88 weight %, the shrinkage amount of the paste becomes large and the surface of the surface layer electrode terminal tends to become a recessed shape right after sintering, even when the etching which is the form in the above-described preferred embodiment is not used, as will be described below. When the amount of the Ag powder is greater than 95 weight %, the viscosity becomes too high, and it is difficult to obtain a paste. In the via conductor paste, in order to improve the via filling characteristics after sintering, Pd powder may be added. When Pd is contained, the sintering of Ag can be inhibited, and it is possible to prevent early shrinkage of conductor paste before ceramics shrinks.

The conductor paste for via conductor may also be used as the conductor paste for the conductor pattern formed on the surface of the ceramic green sheet. Because the conductor paste for via conductor has the above-described advantages, even when the same material is used for the conductor paste of the via conductor and the conductor paste for forming the conductor pattern, the characteristics and function as the via conductor and as the surface conductor pattern can be preferably achieved.

In the above description, the surface of the surface layer via electrode is removed by etching, to achieve a structure in which the surface of the surface layer via electrode is recessed from the surface of the outermost ceramic substrate layer. However, the processes and materials described herein are only exemplary, and the present invention is not limited to these steps and materials.

For example, for the ceramic green sheet of the surface layer, a conductor paste having a volume shrinkage ratio which is larger than the volume shrinkage ratio during sintering may be used, and, for ceramic green sheets laminated below the surface layer, the conductor paste identical to that used in the above-described first preferred embodiment may be used, to form the via conductor and the conductor pattern (circuit pattern) based on the designed circuit. Examples and comparative examples of such a conductor paste are shown in Table 5.

[Table 5]

Figure 9:
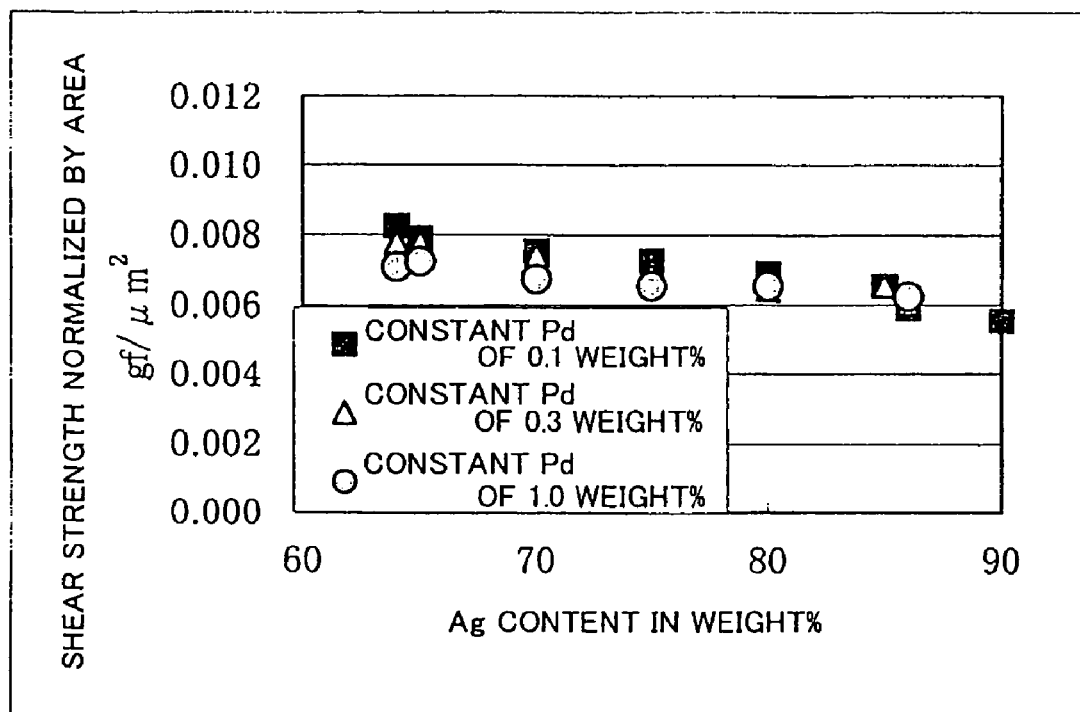
FIG. 9 is an explanatory diagram showing a relationship between Ag concentration of a conductor paste and a shear strength, shown for each Pd content, in a preferred embodiment of the present invention.
Figure 10:
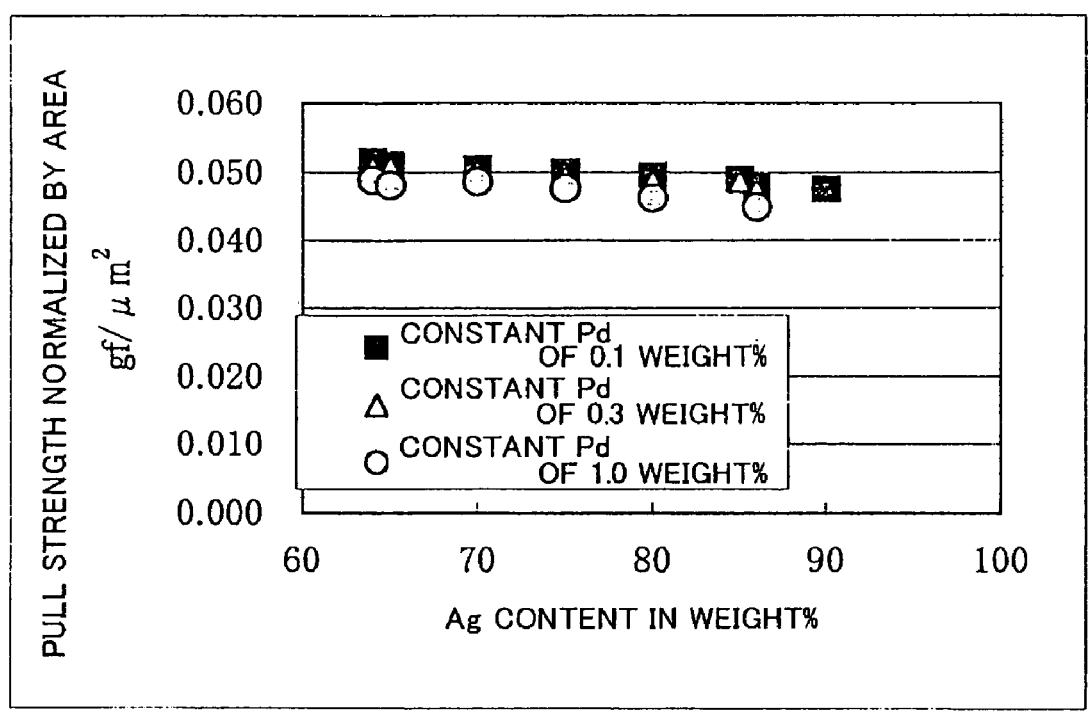
FIG. 10 is an explanatory diagram showing a relationship between Ag concentration of a conductor paste and a pull strength, shown for each Pd content, in a preferred embodiment of the present invention.
Figure 11:
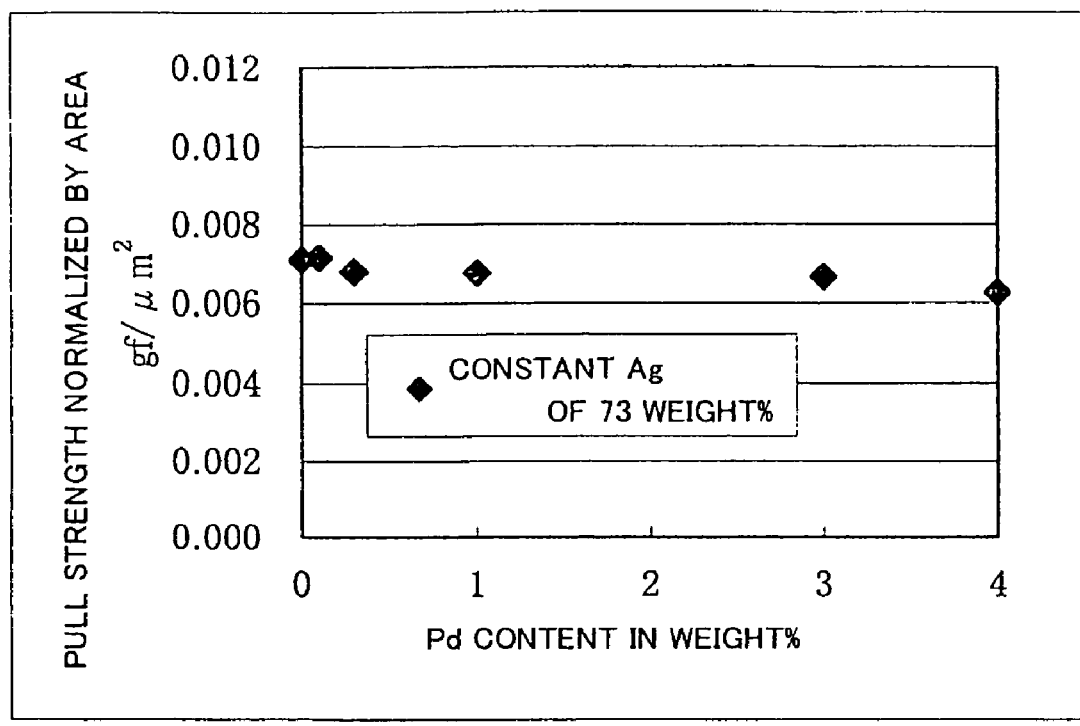
FIG. 11 is an explanatory diagram showing a relationship with a shear strength when Ag concentration of a conductor paste is set constant and Pd content is changed, in a preferred embodiment of the present invention.
Figure 12:
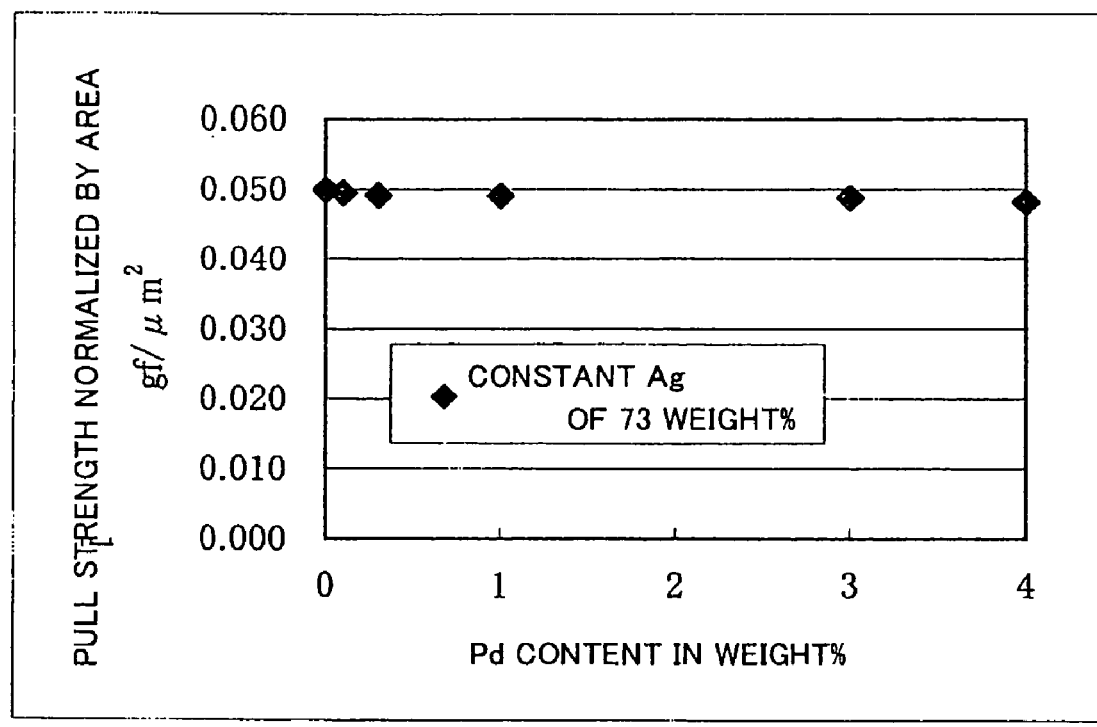
FIG. 12 is an explanatory diagram showing a relationship with a pull strength when Ag concentration of a conductor paste is set constant and Pd content is changed, in a preferred embodiment of the present invention.

As shown in the examples of Table 5, due to shrinkage, via filling may become insufficient and a gap may be created. However, by adding palladium (Pd) powder and by adjusting the content (weight %) of silver (Ag), it is possible to recover the via filling characteristics. In order to obtain a desired shrinkage (d<0 and there is no gap), the configurations shown in Table 5 as examples may be used. FIGS. 9 and 10 show results of measurements of the shear strength and pull strength while the content of the Ag powder is changed for each example having the solder ball of 125 μm, among the examples of Table 5. FIGS. 11 and 12 show the results of the shear strength and pull strength when the Pd content is changed while the content of the Ag powder is set at 73 weight %. According to FIGS. 9 and 10, for example, when the silver (Ag) powder having an average particle diameter of less than 3.0 μm is present in 65 weight %-85 weight %, a desired shear strength and a desired pull strength were obtained. According to FIGS. 11 and 12, the Pd content is preferably less than 3 weight %. From the viewpoint of the via filling characteristics, it is preferable that the Pd content be greater than or equal to 0.1 weight %.

Therefore, it is preferable to set the amount of Ag powder to 65 weight %-85 weight %, the content of Pd to 0.1 weight % or greater and 3 weight % or less, and the total amount of Ag and Pd powders to 65.1 weight %-88 weight %. As described, in the paste used for the surface layer electrode, the content of the Ag powder is low and the volume shrinkage ratio of the conductor paste after sintering is larger than the ceramic green sheet. Because of this, the surface of the surface layer via electrode after sintering is at a level recessed from the surface of the outermost ceramic substrate layer.

In addition, in this case, one printing shot can form the via conductor into the via hole and the conductor pattern (circuit pattern) onto the surface plane at once at least in the ceramic green sheet which will become the outermost ceramic substrate layer. In other words, the via conductor and the conductor pattern may be formed with the conductor paste of the same material.

According to this configuration, the via conductor of the ceramic green sheet of the surface layer in which the above-described conductor paste is used shrinks in a larger degree during sintering, and the surface of the surface layer via electrode is leveled recessed into the inner side of the substrate (inside of the via hole) than the surface of the ceramic substrate layer. Therefore, the surface layer terminal electrode structure of the present embodiment is obtained. However, because the volume shrinkage ratio differs, pores and gaps tend to be formed between the surface and the inner wall of the via hole, and, consequently, the plating agent is easily captured and left in the rough boundary area on the inner wall of the via hole. However, because the normal conductor paste as described above is used for the via conductor and internal circuit pattern of the lower layers, the amount of the volume shrinkage during sintering is in a same degree as the ceramic substrate. Therefore, no defect such as the pore and gap occur between the via conductor and the inner wall of the via hole for the lower layers, and the infiltration of the plating solution is stopped at the lower layers, avoiding the problem of the corrosion resistance.

In the case of this configuration, the etching process of step S11 shown in FIG. 1 is not necessary. However, the etching process may be used in combination. In the process shown in FIG. 1, a plurality of steps may be executed at once if possible.

[Another Example of Manufacturing Method of Multilayer Ceramic Substrate]

Next, another example manufacturing method of a multilayer ceramic substrate according to the present embodiment will be described. In this example method, via holes are formed in the first ceramic green sheet to be positioned at the outermost side of the non-sintered multilayer ceramic structure. The via holes are formed by laser machining, and penetrates through the ceramic green sheet. The shape of the opening of the via hole is approximately circular in the plan view, and, in the ceramic green sheet, the diameter is reduced from the side of laser beam incidence to the side of the laser beam output. Thus, three-dimensionally, the via hole has a tapered shape. The diameter of the opening at the side of the laser beam incidence is set at approximately 60 μm. The ceramic green sheet is formed over a support film, and, as the support film, a PET (polyethylene terephthalate) film which is chemically stable and has a high plasticity may be used.

Next, using a screen and a squeegee, a silver paste is printed and filled into the via hole. In the printing of the first ceramic green sheet, a conductor paste having Ag content of 65 weight % and Pd content of 0.1 weight % may be used. During the printing, in addition to the filling to the via hole, the conductor pattern may be formed based on the necessity in design, on the portions where no via hole is formed. In this case, a mesh in which a fine wire such as a metal or nylon is woven is provided on the screen, and a image of the printing pattern is opened and formed by an emulsion or metal film closely contacted over the mesh. The image opening of the screen and the opening of the ceramic green sheet by the laser machining are placed aligned each other, and the printing process is executed.

Then, a second ceramic green sheet to be laminated adjacent to the first ceramic green sheet of the non-sintered multilayer ceramic structure is created. In the second ceramic green sheet also, the via hole is formed by laser machining similar to the first ceramic green sheet. However, in the second ceramic green sheet, the diameter of the opening at the side of laser beam incidence does not need to be set identical to the diameter in the first ceramic green sheet.

Next, using the screen and the squeegee, a silver paste is printed and filled into the opening. In the printing of the second ceramic green sheet, a conductor paste having Ag content of 85 weight % and Pd content of 0.3 weight % is used. Other conditions such as the screen and the squeegee are similar to those for the case of the first ceramic green sheet. The third and later ceramic green sheets are then created in a manner similar to the second ceramic green sheet.

Finally, the last ceramic green sheet which is to be positioned at the outermost layer on the side opposite and facing to the first ceramic green sheet in the non-sintered multilayer ceramic structure is created. The process of forming the via hole opening by laser machining is similar to that for the first and the second ceramic green sheets. Then, using the screen and the squeegee, a silver paste is printed and filled into the opening. In the printing of the last ceramic green sheet, a conductor paste having Ag content of 65 weight % and Pd content of 0.1 weight % may be used.

The first ceramic green sheet to be positioned at the outermost surface of the non-sintered multilayer ceramic structure is set on a fixing film, and is bonded by pressing with a die at a predetermined pressure, under predetermined temperature, and for a predetermined time period. For example, the pressure may be set at 1 MPa-5 MPa (10 kgf/cm$^2$-50 kgf/cm$^2$), the temperature may be set at 30° C.-60° C., and the time period may be set at 3 seconds-15 seconds. The die at the upper and lower portions of the thermal bonding may have a simple plate shape having a built-in heater. After the bonding by press is completed, the carrier film of the ceramic green sheet is removed. In this process, the green sheet is fixed on the fixing film, and, thus, is not removed with the carrier film during the removal of the carrier film.

Then, the second ceramic green sheet is laminated. On each ceramic green sheet, a conductor pattern for forming the internal circuit pattern is already printed. The ceramic green sheets are set so that one side of the ceramic green sheet contacts the ceramic green sheet of the first layer and, similar to the first ceramic green sheet, the structure is bonded through pressing. In this process, the press temperature may be set to a temperature where the adhesive in the printed paste is softened and fixed, so that the printed portion can be connected with the facing ceramic green sheet under to the pressurizing force. Therefore, the ceramic green sheets are bonded with the printed conductor paste between the sheets. In addition, the portion where there is no electrode and the ceramic layers are directly in contact with each other is also softened, fixed, and bonded similar to the case with the electrode therebetween. Although the bonding temperature depends on the type of the adhesive, normally, the temperature may be a low temperature of about 40° C.-90° C., and the connection strength can be adjusted by changing the pressurizing force. After the bonding, the carrier film of the ceramic green sheet is removed. The third and later ceramic green sheets are laminated in a process similar to the second ceramic green sheet, up to the last ceramic green sheet. In order to strongly integrate the laminated structure, it is possible to remove the fixing film after all sheets are laminated and apply a further bonding process.

A part or all of the sequence of processes of bonding, removal, and lamination may be performed under an atmosphere of a reduced pressure, similar to the above-described preferred embodiment. Then, the non-sintered multilayer ceramic structure is inverted, and a surface conductor pattern is printed and formed on the outermost surface on the opposite side and opposing the first ceramic green sheet. In addition, an insulating paste may be printed and formed on a surface of the non-sintered multilayer ceramic structure, onto the first ceramic green sheet and onto the outermost surface on the opposite side opposing the first ceramic green sheet as necessary. Alternatively, a final bonding process may be applied to the overall non-sintered multilayer ceramic structure in which the printing and lamination processes are completed, to achieve a more reliable integration and flattening.

Then, a shallow groove for breaking is suitably formed on the non-sintered multilayer ceramic structure, a process is applied such as cutting to a size which can be easily handled, and the structure is sintered. The conditions of the sintering are, for example, 900° C. and for 2 hours in an atmospheric sintering atmosphere. With regard to the sintering atmosphere, often, the amount of moisture and the oxygen concentration are modified during the sintering so that evaporation and burning of unnecessary constituents such as an organic substance in the multilayer ceramic structure are promoted, and the reaction and diffusion are controlled so that maximum performance of the material can be obtained.

In the inside of the via hole of the sintered multilayer ceramic structure thus created, a metal plating layer comprising a Ni base layer and a Au coverage is formed through electroless plating, and a multilayer ceramic substrate is completed.

A cross section of the multilayer ceramic substrate completed in the above-described method was formed and the state of the inside was observed. The level of the surface layer via electrode was at d=−2 μm and was at a level of approximately 2.1 μm recessed from the ceramic substrate surface, and the ratio with the via diameter which was 60 μm, d/φ was −0.033. A total plating thickness of 4 μm of the Ni base layer and 0.05 μm of the Au coverage was 4.05 μm, and the surface layer terminal electrode including the plating protruded from the surface of the ceramic substrate by approximately 2 μm. Regarding the internal via electrode of the multilayer ceramic substrate, there was no gap in the boundary with the via hole and the connection portion with the internal circuit pattern.

The multilayer ceramic substrate was divided into individual pieces, soldered to a test print circuit board, and placed in a constant-temperature and constant-humidity chamber, and a "high-temperature and high-humidity bias test" was performed in which a direct current voltage of +4 V was applied to a path based on the intended electrical design under the environment of 85° C. and 85% RH. During the entire test period of 1000 hours, there was no insulation defect and no abnormality in the appearance.

[Preferred Embodiment by Non-Shrinkage Construction Method]

In the case of the manufacturing method which uses the constraining green sheet also, although the shrinkage in the plane at the surface of the ceramic substrate is suppressed, because the constraining force is weak in the thickness direction, a slight recess is formed when the via electrode shrinks.

Figure 8:
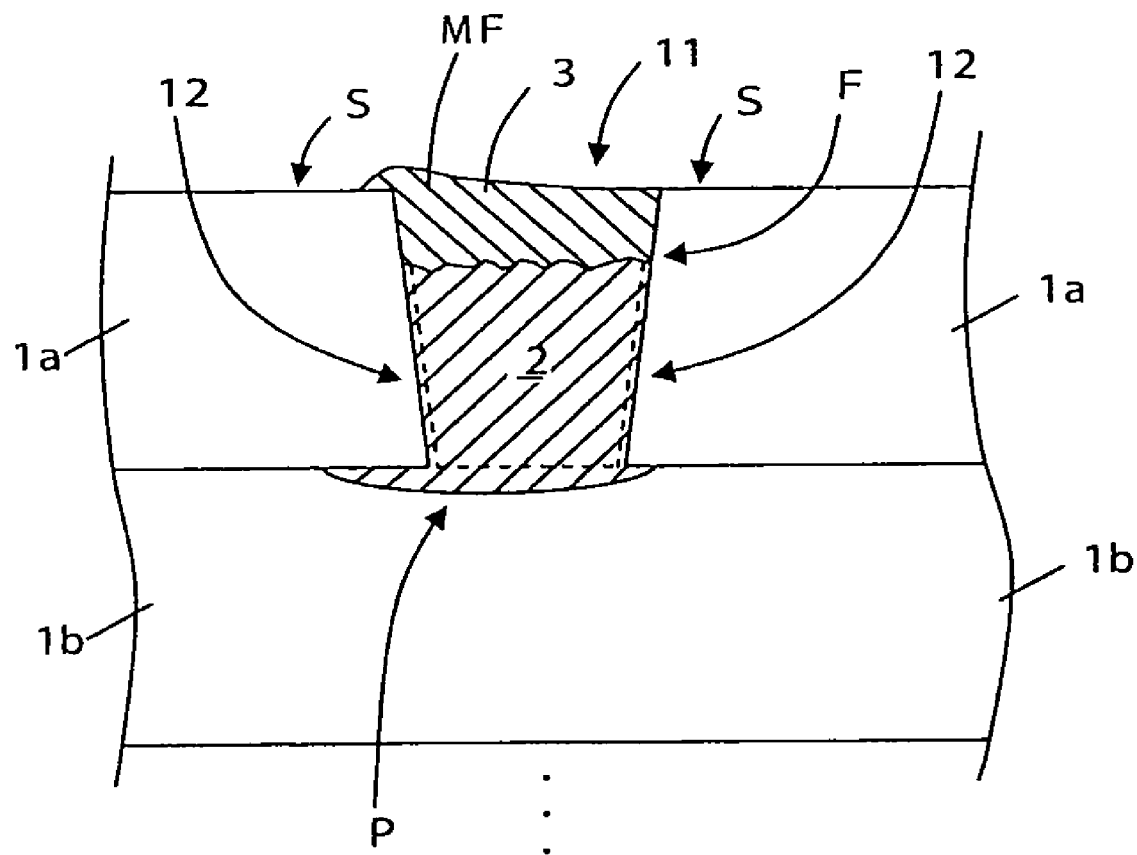
FIG. 8 is a cross sectional view showing an example of a multilayer ceramic substrate according to a preferred embodiment of the present invention.

The multilayer ceramic substrate of the present embodiment is manufactured by a process in which a non-shrinkage construction method is added to the first preferred embodiment described above. In the multilayer ceramic substrate, as shown in FIG. 8 which exemplifies the cross section, a plurality of ceramic substrate layers 1*a*, 1*b*, . . . are laminated. In addition, a via hole 11 is formed in the outermost ceramic substrate layer 1*a* and a via conductor 12 is formed in the via hole 11. The explanation regarding the cross section of FIG. 8 and the following explanation are not limited to a certain embodiment of manufacturing, and are common to the above-described preferred embodiments.

In the via hole 11, a surface layer via electrode 2 is formed. The surface of the surface layer via electrode 2 is at the inside of the via hole 11 provided in the outermost ceramic substrate layer 1*a*, at a level recessed from the surface of the outermost ceramic substrate layer 1*a*. In other words, the surface layer via electrode 2 is electrically connected to a circuit pattern P over the internal ceramic substrate layers 1*a*, 1*b*, . . . . That is, the surface layer via electrode 2 is in a state where the via conductor 12 is extended toward the outermost surface side, and is continuously (electrically) connected to the via conductor 12.

In addition, a metal plating layer 3 is deposited on the surface of the surface layer via electrode 2, and a surface MF of the metal plating layer 3 is at the approximate same plane as the surface S of the outermost ceramic substrate layer (a plane including a projection of 3 μm or less from the surface S) or at a level recessed from the surface S.

In the example configuration of FIG. 8, the cross section of the via hole 11 has a tapered shape in which the size is increased toward the outermost surface, and the metal plating layer 3 is deposited over the surface of the outermost ceramic substrate from the inner wall of the via hole 11 (left end portion). Such a structure can also be assumed to be the approximate same plane. Alternatively, the metal plating layer 3 may be in the via hole 11 and does not need to be deposited over the surface of the ceramic substrate.

The surface of the metal plating layer 3 may protrude over the surface S of the outermost ceramic substrate, but in such a case, the protrusion should be less than or equal to 3 μm and the diameter of the protruded portion may be larger than the diameter of the via hole 11. As the diameter (φ) in the case of the tapered via hole, the diameter of the metal plating layer 3 viewed from top is used.

[Electronic Component]

When such a multilayer ceramic substrate is used, a surface mount component is mounted using a solder ball on the surface of the metal plating layer 3, to assemble an electronic component. The electronic component may be used, for example, in an electronic device such as a cellular phone.

The electronic component to be mounted may be a passive element such as a capacitor, an inductor, and a resistor, or an active element such as a semiconductor product and a module component including an array or the like in which a plurality of the passive components are integrated. In the multilayer ceramic substrate of the present embodiment, not all of the end surfaces of the surface layer via electrodes corresponding to the electronic components need to be at a level recessed from the surface of the outermost ceramic substrate layer. In addition, the size of the via hole does not need to be the same. In other words, it is possible to form a via hole having a diameter φ of 60 μm at the portion where the semiconductor component is mounted during mounting of the upper surface component and form a via hole having a diameter φ of 100 μm at the portion where a chip capacitor and a chip resistor are mounted. The via hole of the diameter φ of 60 μm is formed at the portion where the semiconductor component is mounted because the placement of the pad for connecting semiconductor is narrow such as a pitch of 150 μm to 200 μm and, in the case of the first ceramic green sheet, the via machining diameter must be reduced for a portion corresponding to a narrow pitch.

In a certain example, specifically, a semiconductor product of an outer size of 3 mm×3 mm and a thickness of 0.25 mm is flip-chip-mounted. Here, the shape of the pad for flip chip connection on the surface of the semiconductor product opposing the multilayer ceramic substrate may have an approximate square shape with the side length being 100 μm, and the pads may be set in different spacing depending on the location, between 150 μm to 200 μm. The shape of the surface layer via electrode for connecting the flip chip provided at a surface, of the multilayer ceramic substrate, opposing the semiconductor is set to an approximate circle with a diameter of 100 μm and the pitch of the surface layer via electrode is matched with that of the semiconductor component to be mounted. The passive components are a ceramic chip capacitor and a chip resistor, and two types of components of 1 mm×0.5 mm and 0.6 mm×0.3 mm are used.

The multilayer ceramic substrate is manufactured in the following manner. The manufacturing of the ceramic material which can be sintered at a low temperature and the creation of the ceramic green sheet are similar to the methods described above. Then, a via hole is to be provided in the first ceramic green sheet which is to be positioned at the outermost surface side of the non-sintered multilayer ceramic structure. In the process of forming the via hole, a via having a diameter φ of 60 μm is machined in the portion where the semiconductor device is mounted during mounting of the upper surface component and a via of a diameter φ of 100 μm is machined in the portion where the chip capacitor and the chip resister are mounted.

When these via holes are formed by laser machining, first, the via of the diameter φ 100 μm is machined, and, then, the optical component such as the collimator inside the laser machining device and the machining conditions such as the pulse width and number of shots are changed, to machine the via of the diameter φ 60 μm. The order of machining of via holes of φ 100 μm and φ 60 μm may be in any order. In this manner, in the first ceramic green sheet, via holes having different diameters would be formed in a mixed manner. Alternatively, the via holes may be formed by a mechanical puncher. In this case, pins of φ 100 μm and φ 60 μm are placed in predetermined positions of the die holding the machining pins, so that the via holes of different diameters are machined with one operation. However, in some cases, it may be difficult to stably execute fine machining of φ 100 μm or smaller with the mechanical puncher.

Then, using a screen and a squeegee, a silver paste is printed and filled into the via hole. The printing step of the conductor is executed divided into a plurality of times. First, via filling and printing is executed at the portion where the semiconductor component is to be mounted and where the via of the diameter φ 60 μm is machined, using a conductor paste having Ag content of 80 weight % and Pd content of 0.1 weigh % (the paste having relatively large volume shrinkage during sintering). After this conductor paste is dried, the via filling and printing is executed on the portion where the chip capacitor and the chip resistor are to be mounted and where the via of the diameter φ 100 μm is machined, using a conductor paste having Ag content of 90 weight % and Pd content of 0 weight % (paste having a relatively small volume shrinkage during sintering), and, at the same time, the surface circuit pattern on the surface is also printed.

Next, the second ceramic green sheet to be laminated adjacent to the first ceramic green sheet of the non-sintered multilayer ceramic structure is created. In the second ceramic green sheet also, similar to the first ceramic green sheet, the via hole is formed through laser machining. However, in the second ceramic green sheet, it is not necessary to change the diameter of the via hole machining depending on whether the component to be mounted thereon is a semiconductor component or a chip capacitor or a chip resistor. That is, it is possible not to mix via holes of different diameters and form via holes of only one kind of diameter.

More specifically, in many cases, in the second and later ceramic green sheets, the pitch can be widened little by little by re-placement of the circuit patterns, and the fine via of φ 60 μm or the like is not always required. Therefore, it is possible to use single via machining diameter which is large and allows easy manufacturing, such as φ 100 μm. The actual ceramic green sheet layer count from which the necessity of the fine via disappears differs depending on designs of the individual components and the multilayer ceramic substrate.

For the printing to the second ceramic green sheet, via is filled and printed using a conductor paste having Ag content of 90 weight % and Pd content of 0 weight %. It is also possible to print the surface circuit pattern along with the printing. Then, the via hole machining and conductor printing are executed for third and later ceramic green sheets in a similar manner.

Then, the first ceramic green sheet to be positioned at the outermost surface side of the non-sintered multilayer ceramic structure is set on a fixing film, and bonded through pressing with a die at a predetermined pressure, predetermined temperature, and for a predetermined time period. For example, the pressure is set at 1 MPa-5 MPa (10 kgf/cm$^2$-50 kgf/cm$^2$), the temperature may be set at 30° C.-60° C., and the time period may be 3 seconds-15 seconds. The die at the upper and lower part of the thermal boding may have a simple flat plate shape having a built-in heater. After the bonding by press is completed, the carrier film of the ceramic green sheet is removed. In this process, the green sheet is fixed on the fixing film, and is not removed along with the carrier film when the carrier film is removed.

The bonding and lamination of the second and later ceramic green sheet are executed in a manner similar to the above-described preferred embodiment, to obtain a non-sintered multilayer ceramic structure.

Then, processes are performed such as suitable formation of a shallow breaking groove on the non-sintered multilayer ceramic structure and cutting into a size which can be easily handled, the non-sintered multilayer ceramic structure is sintered under condition of 900° C. and for about 2 hours, and plating is applied, in a manner similar to the above-described preferred embodiment.

The via portion of the sintered multilayer ceramic structure thus created was observed and measured, and the depth d to the surface layer via electrode in the portion where the semiconductor component is to be mounted was −1 μm and the filling characteristics was satisfactory. The shear strength measured while a solder ball of a diameter of 125 μm was mounted was 0.0069 gf/μm$^2$(0.000068 N/μm$^2$), the pull strength measured while mounting a solder ball of a diameter of 500 μm was 0.0496 gf/μm$^2$(0.000486 N/μm$^2$), and both strengths were satisfactory. The multilayer ceramic substrate was divided into individual pieces, soldered to a test print circuit board, and placed in a constant-temperature and constant-humidity chamber, and a "high-temperature and high-humidity bias test" was performed in which a direct current of +4 V is applied to a path based on the original electric design under an environment of 85° C. and 85% RH. During the entire test period of 1000 hours, there was no insulation defect and there was no abnormality in appearance. When the semiconductor component was mounted and the structure was assembled as an electronic component, because the surface layer terminal electrode was at an approximate same plane as the surface of the ceramic substrate, the solder ball was not deviated from the center of the pad and a self-alignment effect was realized, and the structure was assembled with a high precision. Because solder ball mounting method was used instead of the solder paste printing method for the equipment of the semiconductor, there was no pores in the solder after the assembly and a superior connection state was achieved.

Another configuration for manufacturing the multilayer ceramic substrate for use in an electronic component according to the present embodiment will now be described. In this configuration, the manufacturing of the ceramic material which can be sintered at a low temperature, the creation of the ceramic green sheet, and the formation of the via hole are similar to those in the above-described method, and the process of executing the printing step of conductor in a plurality of divided steps in printing and filling the via hole with the silver paste using the screen and squeegee is also similar to the above-described method. However, the filling process of the conductor paste for the portion over which the passive component is to be placed differs.

In this configuration, first, in a portion where the semiconductor component is to be mounted and where via of a diameter φ 60 μm is machined and in a portion where the passive component such as a chip capacitor and a chip resistor is to be mounted and where a via of a diameter φ 100 μm is machined, a via filling and printing is executed using a conductor paste having Ag content of 80 weight % and Pd content of 0.1 weight % (having a relatively large volume shrinkage ratio during sintering), the conductor paste is dried, and a second conductor printing process is executed in the surface circuit pattern portion of the region where the passive component such as the chip capacitor and the chip resistor are to be mounted and the surface, using a conductor paste having Ag content of 90 weight % and Pd content of 0 weight % (having a relatively small volume shrinkage ratio during sintering). In this manner, in the portion where the passive component such as the chip capacitor and the chip resistor is to be mounted, the conductor is doubly printed and a surface layer pad electrode is formed. The portion of the surface layer pad electrode does not necessarily have a clear two-layer structure and includes a portion where the two conductor pastes described above exist in a mixed state, and, thus, can be considered as having a conductor structure with a concentration gradient.

The manufacturing method of the second and later ceramic green sheets and the conductor paste which is used are similar to those in the method of the above-described preferred embodiment. The execution of the bonding, lamination, formation of breaking groove, and sintering and plating are similar to the above-described preferred embodiment.

A via portion of the sintered multilayer ceramic structure thus created was observed and measured, and the depth d to the surface layer via electrode in the portion where the semiconductor component is to be mounted was −1 μm and the filling characteristics was satisfactory. Because the conductor is doubly printed at the portion where the chip capacitor and the chip resistor are to be mounted, the portion is curved in a protruded shape in a positive direction over the surface of the ceramic multilayer substrate.

The multilayer ceramic substrate was divided into individual pieces, soldered to a test print circuit board, and placed in a constant-temperature and constant-humidity chamber, and a "high-temperature and high-humidity bias test" was performed in which a direct current of +4 V was applied to a path based on the original electric design in an environment of 85° C. and 85% RH. During the entire test time of 1000 hours, there was no insulation defect and there was no abnormality in appearance. When the semiconductor component was mounted to assemble the structure as an electronic component, because the surface layer terminal electrode is at the approximate same plane as the surface of the ceramic substrate, the solder ball did not deviate from the center of the pad and the self-alignment effect was achieved, and, thus, the structure was assembled with a high precision. In addition, because a solder ball mounting method was used instead of the solder paste printing method for the semiconductor equipment, there was no pores in the solder after the assembly, and a satisfactory connection state was achieved.

Figure 15:
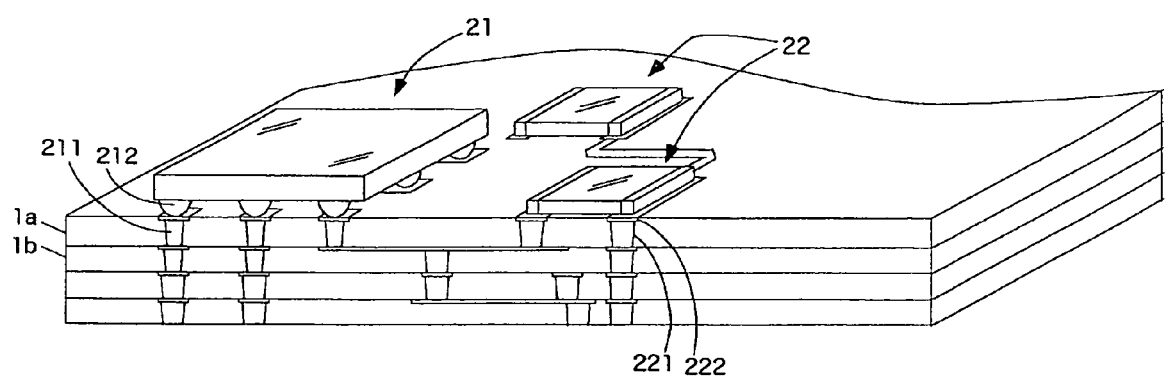
FIG. 15 is an explanatory diagram showing an example of a cross section of a multilayer ceramic substrate 10 according to a preferred embodiment of the present invention to which an electronic component according to a preferred embodiment of the present invention is mounted.

FIG. 15 shows an example of a cross section of a multilayer ceramic substrate 10 of the present embodiment to which an electronic component is mounted. On the upper surface of the multilayer ceramic substrate 10 of the present embodiment, many pad electrodes for mounting components are formed as a conductor pattern, and a passive component 22 such as a resistor and a capacitor (in FIG. 15, the passive component is described as chip component) and an active component 21 by a semiconductor chip such as an IC 21 are mounted on the electrode. The multilayer ceramic substrate comprises an outermost substrate layer and substrate layers laminated to the outermost substrate layer, and, on each substrate layer, internal circuit patterns such as the inductor, transmission line, capacitor, and ground electrode are formed by a conductor pattern, and the internal circuit patterns are connected to each other with the via conductor, to realize the designed circuit patterns. On the lowermost substrate, a pad electrode for connecting the substrate to a mother substrate may be suitably formed.

Figure 16:
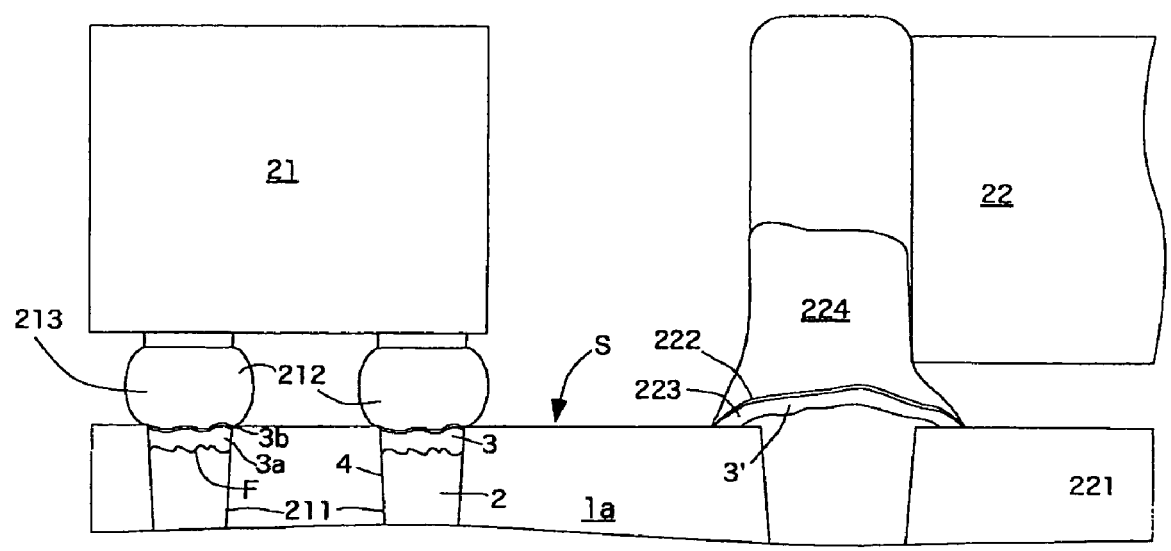
FIG. 16 is an explanatory diagram showing a BGA connection portion and an LGA connection portion of FIG. 15.

In the multilayer ceramic substrate, the active component 21 is mounted on the surface through a BGA connection 212 using a solder ball 213 and the passive component 22 is mounted by an LGA connection 222 using a solder paste on the surface of a pad electrode 223. With regard to the via hole size formed on the surface layer terminal electrode, the size of the via hole 211 of the BGA connection is set smaller than the size of the via hole 221 of the LGA connection. As shown in FIG. 16, for the BGA connection 212 having a relatively small via hole size (electrode on which the IC chip 21 of FIG. 15 is mounted), the end surface of the surface layer via electrode 2 is at the level inside the via hole provided in the outermost ceramic substrate layer and recessed from the surface S of the outermost ceramic substrate layer, and the surface of the metal plating layer 3 deposited on the end surface of the surface layer via electrode 2 is formed protruding from the surface S of the outermost ceramic substrate layer by an amount less than the thickness of the metal plating layer 3 or at the level recessed from the surface S of the outermost ceramic substrate layer. In the LGA connection 222 using a circular or rectangular pad electrode 223 with a lower density than the BGA connection 212, on the other hand, the height of the surface of the metal plating layer 3' is set higher than the height of the surface of the metal plating layer 3 (Au plating 3b) for BGA connection. Therefore, the connection of the passive component 22 can be easily achieved using a solder paste 224 over the surface of the pad electrode 223.

As described, large and small via holes are provided in a mixed manner in the outermost ceramic substrate layer, and the relatively large via hole is used for the LGA connection. Fundamentally, because the connection strength between the electrode formed in the relatively large via hole and the electronic component is relatively large, an electrode similar to the related art would suffice. However, in the BGA connection with the relatively small via hole, the end surface of the surface layer via electrode is at the inside of the via hole provided in the outermost ceramic substrate layer and at a level recessed from the surface of the outermost ceramic substrate layer, and the surface of the metal plating layer deposited on the end surface of the surface layer via electrode is formed at an approximate same plane as the surface of the outermost ceramic substrate layer or at a level recessed from the surface of the outermost ceramic substrate layer. With such a structure, the connection strength can be increased and the machining efficiency can be improved.

The present embodiment also has the following characteristics. Specifically, in the multilayer ceramic substrate, the active element and the passive element are mounted on the surface of the outermost surface, and the via hole size of the surface layer terminal electrode for connecting the active element can be set smaller than the via hole size of the surface layer terminal electrode for connecting the passive element.

In addition, in this structure, in the via holes for the active element and the passive element of the outermost ceramic substrate layer on the one side, a conductor paste having a relatively large volume shrinkage ratio during sintering is filled to form the surface layer via electrode, and, moreover, at least in the via hole for the passive element, a surface layer pad electrode having a double conductor may be formed using a conductor paste having a relatively small volume shrinkage ratio during sintering.

The electronic component is assembled by using any of the above-described multilayer ceramic substrates, and mounting a surface mount component on the metal plating layer using a solder ball.

The surface layer terminal electrode for connection of the active element may be connected to the metal plating layer in the via hole using a solder ball (bump) and the surface layer terminal electrode for connection of the passive element may be connected using the solder paste over the surface of the metal plating layer deposited on the surface layer pad electrode outside of the via hole. In the present embodiment, the former configuration where connection is achieved by the solder ball is called the BGA connection and the latter configuration where connection is achieved using the solder paste on the surface of the pad electrode is called the LGA connection.

In this configuration, the height of the surface of the metal plating layer for connection of the passive element may be set higher than the height of the surface of the metal plating layer for connection of the active element.

According to the present embodiment, first, the via conductor in the via hole is used directly as the surface layer via electrode, the electrode size can be reduced and the electrode can be placed with a narrow spacing that enables high density. Therefore, an overall small-size multilayer ceramic substrate can be realized.

In addition, because the surface layer via electrode is at the level recessed from the outermost surface of the ceramic substrate and the surface of the metal plating layer deposited over the surface layer via electrode and the surface of the outermost ceramic substrate layer are formed at the approximate same plane or in a recessed manner, no starting point of breakdown exists at the end of the metal plating layer, and the connection strength is improved by the anchor effect to M the inner wall of the via hole. Therefore, when the solder ball is connected on the metal plating layer, the strength of the connection can be improved by the structural configuration.

According to the method of manufacturing of the present embodiment, although a recessed space exists in the via hole, the tiny pores in the recessed portion are removed, and the plating agent or the like does not remain. Therefore, no pore or gap exists between the metal plating layer and the inner wall of the via and intrusion of the plating agent can be prevented, to achieve a multilayer ceramic substrate having a low possibility of occurrences of the problems in the insulation and corrosion reliability.

TABLE 1

|  | SHEAR STRENGTH gf/μm2 (BALL SIZE IN DIAMETER 125 μm) | VIA HOLE DIAMETER φ μm | DEPTH TO THE SURFACE LAYER VIA ELECTRODE d μm | d/φ (NO UNIT) |
|---|---|---|---|---|
| EXAMPLE 1-1 | 0.0150 | 50 | −6 | −0.120 |
| EXAMPLE 1-2 | 0.0132 | 60 | −5.8 | −0.097 |
| EXAMPLE 1-3 | 0.0115 | 70 | −5.1 | −0.073 |
| EXAMPLE 1-4 | 0.0107 | 83 | −4.9 | −0.059 |
| EXAMPLE 1-5 | 0.0137 | 90 | −10.5 | −0.117 |
| EXAMPLE 1-6 | 0.0110 | 90 | −6 | −0.067 |
| EXAMPLE 1-7 | 0.0090 | 105 | −3.6 | −0.034 |
| EXAMPLE 1-8 | 0.0072 | 125 | −2.4 | −0.019 |
| EXAMPLE 1-9 | 0.0064 | 150 | −2.4 | −0.016 |
| COMPARATIVE EXAMPLE 1 | 0.0016 | 78 | 2.6 | 0.033 |
| COMPARATIVE EXAMPLE 2 | 0.0007 | 89 | 4 | 0.045 |
| COMPARATIVE EXAMPLE 3 | 0.0049 | 100 | 3.7 | 0.037 |
| COMPARATIVE EXAMPLE 4 | 0.0046 | 119 | 4.5 | 0.038 |

TABLE 2

|  | SHEAR STRENGTH gf/μm2 (BALL SIZE IN DIAMETER 300 μm) | VIA HOLE DIAMETER φ μm | DEPTH TO THE SURFACE LAYER VIA ELECTRODE d μm | d/φ (NO UNIT) |
|---|---|---|---|---|
| EXAMPLE 2-1 | 0.0110 | 50 | −6 | −0.120 |
| EXAMPLE 2-2 | 0.0094 | 60 | −5.8 | −0.097 |
| EXAMPLE 2-3 | 0.0079 | 70 | −5.1 | −0.073 |
| EXAMPLE 2-4 | 0.0067 | 83 | −4.9 | −0.059 |
| EXAMPLE 2-5 | 0.0095 | 90 | −10.5 | −0.117 |
| EXAMPLE 2-6 | 0.0069 | 90 | −6 | −0.067 |
| EXAMPLE 2-7 | 0.0047 | 105 | −3.6 | −0.034 |
| EXAMPLE 2-8 | 0.0045 | 125 | −2.4 | −0.019 |
| EXAMPLE 2-9 | 0.0049 | 150 | −2.4 | −0.016 |
| EXAMPLE 2-10 | 0.0044 | 191 | −2.4 | −0.013 |
| EXAMPLE 2-11 | 0.0029 | 250 | −2.4 | −0.010 |
| EXAMPLE 2-12 | 0.0031 | 280 | −2.4 | −0.009 |
| EXAMPLE 2-13 | 0.0028 | 300 | −2.4 | −0.008 |
| COMPARATIVE EXAMPLE 1 | 0.0001 | 78 | 2.6 | 0.033 |
| COMPARATIVE EXAMPLE 2 | 0.0001 | 89 | 4 | 0.045 |
| COMPARATIVE EXAMPLE 3 | 0.0002 | 100 | 3.7 | 0.037 |
| COMPARATIVE EXAMPLE 4 | 0.0004 | 119 | 4.5 | 0.038 |

TABLE 3

|  | PULL STRENGTH gf/μm2 (BALL SIZE IN DIAMETER 500 μm) | VIA HOLE DIAMETER φ μm | DEPTH TO THE SURFACE LAYER VIA ELECTRODE d μm | d/φ (NO UNIT) | THICKNESS OF METAL PLATING LAYER μm | THICKNESS OF Ni PLATING LAYER IN THICKNESS OF PLATING μm | HEIGHT OF SURFACE LAYER TERMINAL ELECTRODE μm |
|---|---|---|---|---|---|---|---|
| EXAMPLE 3-1 | 0.060 | 50 | −6 | −0.120 | 5.9 | 5.8 | −0.1 |
| EXAMPLE 3-2 | 0.058 | 60 | −5.8 | −0.097 | 7.2 | 6.9 | 1.4 |
| EXAMPLE 3-3 | 0.055 | 70 | −5.1 | −0.073 | 6.0 | 5.9 | 0.9 |
| EXAMPLE 3-4 | 0.059 | 83 | −4.9 | −0.059 | 5.5 | 5.4 | 0.6 |
| EXAMPLE 3-5 | 0.062 | 90 | −10.5 | −0.117 | 8.5 | 8.3 | −2.0 |
| EXAMPLE 3-6 | 0.056 | 90 | −6 | −0.067 | 8.5 | 8.3 | 2.5 |
| EXAMPLE 3-7 | 0.051 | 105 | −3.6 | −0.034 | 4.8 | 4.5 | 1.2 |
| EXAMPLE 3-8 | 0.050 | 125 | −2.4 | −0.019 | 5.0 | 4.8 | 2.6 |
| EXAMPLE 3-9 | 0.052 | 150 | −2.4 | −0.016 | 5.3 | 5.0 | 2.9 |
| EXAMPLE 3-10 | 0.048 | 191 | −2.4 | −0.013 | 4.9 | 4.8 | 2.5 |
| EXAMPLE 3-11 | 0.049 | 250 | −2.4 | −0.010 | 5.2 | 5.0 | 2.8 |
| EXAMPLE 3-12 | 0.048 | 280 | −2.4 | −0.009 | 5.0 | 4.6 | 2.6 |

TABLE 3-continued

|  | PULL STRENGTH gf/μm2 (BALL SIZE IN DIAMETER 500 μm) | VIA HOLE DIAMETER φ μm | DEPTH TO THE SURFACE LAYER VIA ELECTRODE d μm | d/φ (NO UNIT) | THICKNESS OF METAL PLATING LAYER μm | THICKNESS OF Ni PLATING LAYER IN THICKNESS OF PLATING μm | HEIGHT OF SURFACE LAYER TERMINAL ELECTRODE μm |
|---|---|---|---|---|---|---|---|
| EXAMPLE 3-13 | 0.048 | 300 | −2.4 | −0.008 | 5.4 | 5.3 | 3.0 |
| COMPARATIVE EXAMPLE 1 | 0.045 | 78 | 2.6 | 0.033 | 5.8 | 5.7 | 8.4 |
| COMPARATIVE EXAMPLE 2 | 0.043 | 89 | 4 | 0.045 | 2.0 | 1.9 | 6.0 |
| COMPARATIVE EXAMPLE 3 | 0.043 | 100 | 3.7 | 0.037 | 5.3 | 5.0 | 9.0 |
| COMPARATIVE EXAMPLE 4 | 0.044 | 119 | 4.5 | 0.038 | 7.1 | 6.9 | 11.6 |

TABLE 4

|  | PULL STRENGTH gf/μm2 (BALL SIZE IN DIAMETER 500 μm) | VIA HOLE DIAMETER φ μm | DEPTH TO THE SURFACE LAYER VIA ELECTRODE d μm | d/φ (NO UNIT) | ROUGHNESS WIDTH w μm | CONTACT LENGTH L μm |
|---|---|---|---|---|---|---|
| EXAMPLE 3-1 | 0.060 | 50 | −6 | −0.120 | 4.3 | 7.8 |
| EXAMPLE 3-2 | 0.058 | 60 | −5.8 | −0.097 | 1.9 | 8.0 |
| EXAMPLE 3-3 | 0.055 | 70 | −5.1 | −0.073 | 1.6 | 7.7 |
| EXAMPLE 3-4 | 0.059 | 83 | −4.9 | −0.059 | 3.1 | 5.7 |
| EXAMPLE 3-5 | 0.062 | 90 | −10.5 | −0.117 | 2.4 | 11.9 |
| EXAMPLE 3-6 | 0.056 | 90 | −6 | −0.067 | 2.5 | 7.0 |
| EXAMPLE 3-7 | 0.051 | 105 | −3.6 | −0.034 | 1.2 | 5.2 |
| EXAMPLE 3-8 | 0.050 | 125 | −2.4 | −0.019 | 1.1 | 3.5 |
| EXAMPLE 3-9 | 0.052 | 150 | −2.4 | −0.016 | 1.3 | 4.0 |
| EXAMPLE 3-10 | 0.048 | 191 | −2.4 | −0.013 | 0.9 | 3.1 |
| EXAMPLE 3-11 | 0.049 | 250 | −2.4 | −0.010 | 1.0 | 3.0 |
| EXAMPLE 3-12 | 0.048 | 280 | −2.4 | −0.009 | 0.9 | 3.2 |
| EXAMPLE 3-13 | 0.048 | 300 | −2.4 | −0.008 | 0.9 | 2.2 |
| COMPARATIVE EXAMPLE 1 | 0.045 | 78 | 2.6 | 0.033 | 0.4 | 1.9 |
| COMPARATIVE EXAMPLE 2 | 0.043 | 89 | 4 | 0.045 | 0.1 | 0.3 |
| COMPARATIVE EXAMPLE 3 | 0.043 | 100 | 3.7 | 0.037 | 0.5 | 1.0 |
| COMPARATIVE EXAMPLE 4 | 0.044 | 119 | 4.5 | 0.038 | 0.5 | 0.0 |

TABLE 5

|  | CONDUCTOR PASTE CONCENTRATION (WEIGHT %) | | DEPTH d TO ELECTRODE (μm) | VIA HOLE DIAMETER φ (μm) | RATIO (d/φ) | VIA FILLING CHARACTERISTIC | SHEAR STRENGTH gf/μm2 (BALL SIZE IN DIAMETER 125 μm) | PULL STRENGTH (BALL SIZE IN DIAMETER 125 μm) | DETERMINATION |
|---|---|---|---|---|---|---|---|---|---|
|  | Ag WEIGHT | Pd WEIGHT | | | | | | | |
| COMPARATIVE EXAMPLE | 64 | 0 | −3.5 | 83 | −0.042 | SOME GAP | 0.0092 | 0.0530 | X |
| COMPARATIVE EXAMPLE | 64 | 0.1 | −2.5 | 83 | −0.030 | SOME GAP | 0.0083 | 0.0516 | X |
| EXAMPLE | 65 | 0.1 | −2.1 | 83 | −0.025 | NO GAP | 0.0079 | 0.0511 | ○ |
| EXAMPLE | 70 | 0.1 | −1.7 | 83 | −0.020 | NO GAP | 0.0075 | 0.0505 | ○ |
| EXAMPLE | 75 | 0.1 | −1.4 | 83 | −0.017 | NO GAP | 0.0073 | 0.0501 | ○ |
| EXAMPLE | 80 | 0.1 | −1 | 83 | −0.012 | NO GAP | 0.0069 | 0.0496 | ○ |
| EXAMPLE | 85 | 0.1 | −0.6 | 83 | −0.007 | NO GAP | 0.0065 | 0.0490 | ○ |
| COMPARATIVE EXAMPLE | 86 | 0.1 | 0.1 | 83 | 0.001 | NO GAP | 0.0059 | 0.0481 | X |
| COMPARATIVE EXAMPLE | 90 | 0.1 | 0.5 | 83 | 0.006 | NO GAP | 0.0055 | 0.0475 | X |
| COMPARATIVE EXAMPLE | 64 | 0.3 | −2 | 83 | −0.024 | SOME GAP | 0.0078 | 0.0509 | X |
| EXAMPLE | 65 | 0.3 | −2 | 83 | −0.024 | NO GAP | 0.0078 | 0.0509 | ○ |
| EXAMPLE | 70 | 0.3 | −1.6 | 83 | −0.019 | NO GAP | 0.0074 | 0.0504 | ○ |
| EXAMPLE | 75 | 0.3 | −1 | 83 | −0.012 | NO GAP | 0.0069 | 0.0496 | ○ |
| EXAMPLE | 80 | 0.3 | −0.5 | 83 | −0.006 | NO GAP | 0.0065 | 0.0489 | ○ |
| EXAMPLE | 85 | 0.3 | −0.4 | 83 | −0.005 | NO GAP | 0.0066 | 0.0487 | ○ |

TABLE 5-continued

| | CONDUCTOR PASTE CONCENTRATION (WEIGHT %) | | DEPTH d TO ELEC- TRODE (µm) | VIA HOLE | | VIA FILLING CHARACTER- ISTIC | SHEAR STRENGTH gf/µm2 (BALL SIZE IN DIAMETER 125 µm) | PULL STRENGTH (BALL SIZE IN DIAMETER 125 µm) | DETERMINA- TION |
|---|---|---|---|---|---|---|---|---|---|
| | Ag WEIGHT | Pd WEIGHT | | DIAMETER φ (µm) | RATIO (d/φ) | | | | |
| COMPARATIVE EXAMPLE | 86 | 0.3 | 0.5 | 83 | 0.006 | NO GAP | 0.0060 | 0.0475 | X |
| COMPARATIVE EXAMPLE | 64 | 1 | −2.2 | 150 | −0.015 | SOME GAP | 0.0071 | 0.0489 | X |
| EXAMPLE | 65 | 1 | −2.5 | 150 | −0.017 | NO GAP | 0.0072 | 0.0481 | ○ |
| EXAMPLE | 70 | 1 | −1.5 | 150 | −0.010 | NO GAP | 0.0067 | 0.0486 | ○ |
| EXAMPLE | 75 | 1 | −1.1 | 150 | −0.007 | NO GAP | 0.0065 | 0.0476 | ○ |
| EXAMPLE | 80 | 1 | −0.7 | 150 | −0.005 | NO GAP | 0.0065 | 0.0462 | ○ |
| COMPARATIVE EXAMPLE | 86 | 1 | 0.3 | 150 | 0.002 | NO GAP | 0.0063 | 0.0449 | X |
| COMPARATIVE EXAMPLE | 73 | 0 | −2.2 | 150 | −0.015 | SOME GAP | 0.0071 | 0.0499 | X |
| EXAMPLE | 73 | 0.1 | −1.7 | 150 | −0.011 | NO GAP | 0.0071 | 0.0495 | ○ |
| EXAMPLE | 73 | 0.3 | −1.2 | 150 | −0.008 | NO GAP | 0.0068 | 0.0491 | ○ |
| EXAMPLE | 73 | 1 | −1.1 | 150 | −0.007 | NO GAP | 0.0067 | 0.0490 | ○ |
| EXAMPLE | 73 | 3 | −0.7 | 150 | −0.005 | NO GAP | 0.0066 | 0.0487 | ○ |
| COMPARATIVE EXAMPLE | 73 | 4 | 0.1 | 150 | 0.001 | NO GAP | 0.0063 | 0.0481 | X |

What is claimed is:

1. A multilayer ceramic substrate in which a plurality of ceramic substrate layers are laminated, the multilayer ceramic substrate comprising:

a surface layer terminal electrode which is provided at an outermost ceramic substrate layer on at least one side of a front side and a back side and which comprises a surface layer via electrode and a metal plating layer deposited over an end surface of the surface layer via electrode; and a via conductor which connects the surface layer terminal electrode and circuit patterns over an internal ceramic substrate layer, wherein the surface layer via electrode has it-s-the end surface in a via hole provided in the outermost ceramic substrate layer and at a level recessed from a surface of the outermost ceramic substrate layer, and a surface of the metal plating layer deposited over the end surface of the surface layer via electrode is at substantially same plane level as the surface of the outermost ceramic substrate layer or at a level recessed from the surface of the outermost ceramic substrate layer, wherein the metal plating layer matches, without a gap, at a boundary contacting an inner wall of the via hole.

2. The multilayer ceramic substrate according to claim 1, wherein a ratio (d/φ) between a depth (d; with a direction toward inside of the substrate being negative) of the end surface of the surface layer via electrode when the surface of the outermost ceramic substrate layer is a ±0 reference plane and a diameter (φ) of the via hole is a negative value between 0 and −0.12.

3. The multilayer ceramic substrate according to claim 1, wherein the metal plating layer matches, without a gap, at a boundary contacting an inner wall of the via hole, and when the boundary is viewed in a cross section along a depth direction, a contact length (L) of the boundary is greater than or equal to 2 µm.

4. The multilayer ceramic substrate according to claim 1, wherein the metal plating layer matches, without a gap, at a boundary contacting inner walls of the via holes, and when the boundary is viewed in a cross section along a depth direction, the boundary has a roughness width (w) of a maximum and minimum of projections and recesses of greater than or equal to 0.6 µm.

5. The multilayer ceramic substrate according to claim 1, wherein the metal plating layer comprises a Ni base layer and a Au coverage layer, and a thickness of the Ni base layer deposited over the end surface of the surface layer via electrode is greater than or equal to 3 µm.

6. The multilayer ceramic substrate according to claim 1, wherein the via hole provided in the outermost ceramic substrate layer is formed in a tapered hole shape which widens toward the outermost surface.

7. The multilayer ceramic substrate according to claim 1, wherein an active element and a passive element are to be mounted on a surface of the multilayer ceramic substrate, and a via hole size of a surface layer terminal electrode for connection of the active element is smaller than a via hole size of a surface layer terminal electrode for connection of the passive element.

8. The multilayer ceramic substrate according to claim 7, wherein for via holes for active element and passive element of the outermost ceramic substrate layer on one side, a conductor paste is filled to form a surface layer via electrode, and, for at least the via hole for the passive element, a surface layer pad electrode having a double conductor structure is formed using a conductor paste having a relatively small volume shrinkage ratio during sintering compared to the conductor paste filled to form a surface layer via electrode.

9. An electronic component which uses the multilayer ceramic substrate according to claim 1, wherein a surface mounting component is mounted using a solder ball over the metal plating layer.

10. The electronic component according to claim 9, wherein a surface layer terminal electrode for connection of the active element of the multilayer ceramic substrate is connected using a solder ball (bump) over a metal plating layer in the via hole, and a surface terminal electrode for connection of the passive element is connected using a solder paste over the surface of the metal plating layer deposited over the surface layer pad electrode outside of the via hole.

11. The electronic component according to claim 10, wherein a height of the surface of the metal plating layer for connection of the passive element is higher than a height of the surface of the metal plating layer for connection of the active element.

12. The multilayer ceramic substrate according to claim 1, wherein the ceramic substrate is made from Low Temperature Co-fired Ceramics material.

* * * * *